US012572070B2

(12) United States Patent
Kamimura

(10) Patent No.: US 12,572,070 B2
(45) Date of Patent: Mar. 10, 2026

(54) CHEMICAL LIQUID, RESIST PATTERN FORMING METHOD, SEMICONDUCTOR CHIP MANUFACTURING METHOD, CHEMICAL LIQUID STORAGE BODY, AND CHEMICAL LIQUID MANUFACTURING METHOD

(71) Applicant: FUJIFILM Corporation, Tokyo (JP)

(72) Inventor: Tetsuya Kamimura, Shizuoka (JP)

(73) Assignee: FUJIFILM Corporation, Tokyo (JP)

(*) Notice: Subject to any disclaimer, the term of this patent is extended or adjusted under 35 U.S.C. 154(b) by 729 days.

(21) Appl. No.: 17/401,347

(22) Filed: Aug. 13, 2021

(65) Prior Publication Data

US 2021/0373439 A1 Dec. 2, 2021

Related U.S. Application Data

(63) Continuation of application No. PCT/JP2020/003178, filed on Jan. 29, 2020.

(30) Foreign Application Priority Data

Feb. 21, 2019 (JP) ................................ 2019-029633

(51) Int. Cl.
*G03F 7/038* (2006.01)
*B82Y 40/00* (2011.01)
*G03F 7/16* (2006.01)
*G03F 7/32* (2006.01)
*G03F 7/38* (2006.01)
*G03F 7/40* (2006.01)

(52) U.S. Cl.
CPC .............. *G03F 7/0382* (2013.01); *G03F 7/16* (2013.01); *G03F 7/162* (2013.01); *G03F 7/322* (2013.01); *G03F 7/38* (2013.01); *G03F 7/40* (2013.01); *B82Y 40/00* (2013.01)

(58) Field of Classification Search
CPC .......... G03F 7/0382; G03F 7/16; G03F 7/162; G03F 7/322; G03F 7/38; G03F 7/40; G03F 7/32; B82Y 40/00
See application file for complete search history.

(56) References Cited

U.S. PATENT DOCUMENTS

| | | | | |
|---|---|---|---|---|
| 6,117,486 | A | 9/2000 | Yoshihara | |
| 2019/0025701 | A1* | 1/2019 | Kamimura | G03F 7/2006 |
| 2019/0025703 | A1* | 1/2019 | Shimizu | H01L 21/0274 |
| 2019/0033718 | A1 | 1/2019 | Kamimura | |

(Continued)

FOREIGN PATENT DOCUMENTS

| | | |
|---|---|---|
| CN | 108885413 | 11/2018 |
| CN | 109074001 | 12/2018 |
| EP | 1433774 | 6/2004 |

(Continued)

OTHER PUBLICATIONS

Musser, M.T. (2011). Cyclohexanol and Cyclohexanone. In Ullmann's Encyclopedia of Industrial Chemistry, (Ed.). https://doi.org/10.1002/14356007.a08_217.pub2 (Year: 2011).*

Efimova, G. "Cyclohexanone Autocondensation." Zhurnal Organicheskoi Khimii 25.6 (1989): 1201-1204. Print. (Year: 1989).*

English machine translation of Efimova, G. "Cyclohexanone Autocondensation." Zhurnal Organicheskoi Khimii 25.6 (1989): 1201-1204. Print. (Year: 1989).*

"Office Action of Korea Counterpart Application", issued on Jul. 25, 2023, with English translation thereof, p. 1-p. 14.

Zdeněk Vít et al., "Liquid-Phase Aldol Condensation of Cyclohexanone on Aluminium and Iron Oxides," Collect. Czech. Chem. Commun., vol. 47, Sep. 1981, pp. 2235-2245.

Office Action of China Counterpart Application, with English translation thereof, issued on Nov. 10, 2022, pp. 1-13.

(Continued)

*Primary Examiner* — Jonathan Johnson
*Assistant Examiner* — Jayson D Cosgrove
(74) *Attorney, Agent, or Firm* — JCIPRNET

(57) ABSTRACT

The present invention provides a chemical liquid demonstrating excellent defect inhibition performance in a case where the chemical liquid is used as a prewet solution. The present invention also provides a resist pattern forming method, a semiconductor chip manufacturing method, a chemical liquid storage body, and a chemical liquid manufacturing method. The chemical liquid according to an embodiment of the present invention is a chemical liquid to be used as a prewet solution and contains cyclohexanone and one or more kinds of first compounds selected from the group consisting of a compound represented by General Formula (1), a compound represented by General Formula (2), and a compound represented by General Formula (3), in which a content of the cyclohexanone is 98.000% to 99.999% by mass with respect to a total mass of the chemical liquid, and a total content of the first compounds is 0.001 to 100 ppm by mass with respect to the total mass of the chemical liquid.

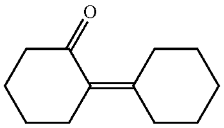

(1)

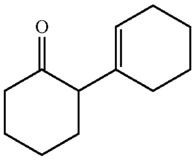

(2)

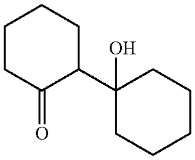

(3)

23 Claims, No Drawings

(56) References Cited

U.S. PATENT DOCUMENTS

| | | | |
|---|---|---|---|
| 2019/0219923 A1 | 7/2019 | Kamimura et al. |
| 2022/0221798 A1 | 7/2022 | Kamimura |

FOREIGN PATENT DOCUMENTS

| | | | |
|---|---|---|---|
| JP | 2004039828 | 2/2004 | |
| JP | 2006005335 | 1/2006 | |
| KR | 1020180124134 | 11/2018 | |
| TW | 201807183 | 3/2018 | |
| WO | 2017169833 | 10/2017 | |
| WO | WO-2017169832 A1 * | 10/2017 | ............ B65D 25/14 |
| WO | WO-2017169833 A1 * | 10/2017 | .............. G03F 7/16 |
| WO | 2018061573 | 4/2018 | |

OTHER PUBLICATIONS

Office Action of Israel Counterpart Application, issued on Nov. 14, 2023, pp. 1-4.

Office Action of Korea Counterpart Application, with English translation thereof, issued on Dec. 13, 2023, pp. 1-9.

Office Action of Taiwan Counterpart Application, with English translation thereof, issued on Jul. 11, 2023, pp. 1-9.

"Search Report of Europe Counterpart Application", issued on Mar. 18, 2022, pp. 1-11.

Alexandre C. Dimian et al., "Phenol Hydrogenation to Cyclohexanone", Chemical Process Design: Computer-Aided Case Studies, Chapter 5, Mar. 2008, pp. 129-172.

E. A. Martynenko et al., "Cyclohexanone in the production of caprolactam. Problem and solutions" , Russian Chemical Bulletin, vol. 65, Issue 10, Oct. 2016, pp. 2513-2521.

"International Search Report (Form PCT/ISA/210) of PCT/JP2020/003178," mailed on Mar. 24, 2020, with English translation thereof, pp. 1-5.

"Written Opinion of the International Searching Authority (Form PCT/ISA/237)" of PCT/JP2020/003178, mailed on Mar. 24, 2020, with English translation thereof, pp. 1-6.

Office Action of China Counterpart Application, with English translation thereof, issued on Jun. 6, 2022, pp. 1-12.

Office Action of Japan Counterpart Application, with English translation thereof, issued on Jun. 28, 2022, pp. 1-10.

Office Action of Korea Counterpart Application, with English translation thereof, issued on Apr. 12, 2024, pp. 1-10.

Office Action of Japan Counterpart Application, with English translation thereof, issued on Mar. 26, 2024, pp. 1-11.

* cited by examiner

CHEMICAL LIQUID, RESIST PATTERN FORMING METHOD, SEMICONDUCTOR CHIP MANUFACTURING METHOD, CHEMICAL LIQUID STORAGE BODY, AND CHEMICAL LIQUID MANUFACTURING METHOD

CROSS-REFERENCE TO RELATED APPLICATIONS

This application is a Continuation of PCT International Application No. PCT/JP2020/003178 filed on Jan. 29, 2020, which claims priority under 35 U.S.C. § 119(a) to Japanese Patent Application No. 2019-029633 filed on Feb. 21, 2019. The above application is hereby expressly incorporated by reference, in its entirety, into the present application.

BACKGROUND OF THE INVENTION

1. Field of the Invention

The present invention relates to a chemical liquid, a resist pattern forming method, a semiconductor chip manufacturing method, a chemical liquid storage body, and a chemical liquid manufacturing method.

2. Description of the Related Art

In the manufacturing of semiconductor devices, a chemical liquid containing an organic solvent is used as a prewet solution.

In recent years, with the advancement of semiconductor products, higher defect inhibition performance has been required for the chemical liquid used for semiconductor manufacturing.

JP2004-039828A describes "prewet agent that is a solvent for dissolving a coating solution supplied to a substrate to be treated and has a viscosity of 2.0 cP (centipoise) or more (Claim 1)" as an example of the chemical liquid used as a prewet solution, and cites cyclohexanone as a specific example thereof (Claim 5).

SUMMARY OF THE INVENTION

The inventors of the present invention have found that there is room for further improvement of the defect occurrence inhibition performance that the above prewet agent demonstrates in a case where the agent is used in semiconductor device manufacturing process.

Therefore, an object of the present invention is to provide a chemical liquid demonstrating excellent defect inhibition performance in a case where the chemical liquid is used as a prewet solution.

Another object of the present invention is to provide a resist pattern forming method, a semiconductor chip manufacturing method, a chemical liquid storage body, and a chemical liquid manufacturing method.

In order to achieve the above objects, the inventors of the present invention carried out intensive examinations. As a result, the inventors have found that the objects can be achieved by the following constitution.

[1]

A chemical liquid to be used as a prewet solution, containing cyclohexanone, and one or more kinds of first compounds selected from the group consisting of a compound represented by General Formula (1), a compound represented by General Formula (2), and a compound represented by General Formula (3), in which a content of the cyclohexanone is 98.000% to 99.999% by mass with respect to a total mass of the chemical liquid, and a total content of the first compounds is 0.001 to 100 ppm by mass with respect to the total mass of the chemical liquid.

(1)

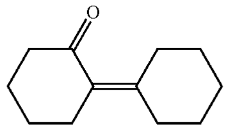

(2)

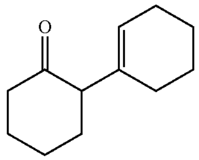

(3)

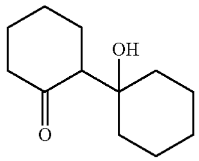

[2]

The chemical liquid described in [1], in which a content of the compound represented by General Formula (1) is 0.01 to 70 ppm by mass with respect to the total mass of the chemical liquid.

[3]

The chemical liquid described in [1] or [2], in which the total content of the first compounds is 0.005 to 95 ppm by mass with respect to the total mass of the chemical liquid.

[4]

The chemical liquid described in any one of [1] to [3], in which a mass ratio of a content of the compound represented by General Formula (1) to a content of the compound represented by General Formula (2) is 1 to 500.

[5]

The chemical liquid described in any one of [1] to [4], in which a mass ratio of a content of the compound represented by General Formula (1) to a content of the compound represented by General Formula (3) is 1 to 3,000.

[6]

The chemical liquid described in any one of [1] to [5], in which a mass ratio of a content of the compound represented by General Formula (2) to a content of the compound represented by General Formula (3) is 1 to 150.

[7]

The chemical liquid described in any one of [1] to [6], further containing one or more kinds of hydroxycyclohexanones selected from the group consisting of 2-hydroxycyclohexanone, 3-hydroxycyclohexanone, and 4-hydroxycyclohexanone, in which a total content of the hydroxycyclohexanones is 0.001 to 1,000 ppm by mass with respect to the total mass of the chemical liquid.

[8]

The chemical liquid described in [7], in which a mass ratio of a content of the 2-hydroxycyclohexanone to a content of the 3-hydroxycyclohexanone is 0.005 to 300.

[9]

The chemical liquid described in [7] or [8], in which a mass ratio of a content of the 2-hydroxycyclohexanone to a content of the 4-hydroxycyclohexanone is 0.01 to 15.

[10]

The chemical liquid described in any one of [7] to [9], in which a mass ratio of a content of the 3-hydroxycyclohexanone to a content of the 4-hydroxycyclohexanone is 0.003 to 100.

[11]

The chemical liquid described in any one of [1] to [10], further containing 1,2-cyclohexanedione, in which a content of the 1,2-cyclohexanedione is 0.0005 to 40 ppm by mass with respect to the total mass of the chemical liquid.

[12]

The chemical liquid described in any one of [1] to [11], further containing cyclohexanol, in which a content of the cyclohexanol is 0.0003 to 30 ppm by mass with respect to the total mass of the chemical liquid.

[13]

The chemical liquid described in any one of [1] to [12], further containing 1-hexanoic acid, in which a content of the 1-hexanoic acid is 5 to 600 ppm by mass with respect to the total mass of the chemical liquid.

[14]

The chemical liquid described in any one of [1] to [13], containing 1,2-cyclohexanedione and cyclohexanol, in which a mass ratio of a content of the 1,2-cyclohexanedione to a content of the cyclohexanol is 0.2 to 400.

[15]

The chemical liquid described in any one of [1] to [14], containing 1,2-cyclohexanedione and 1-hexanoic acid, in which a mass ratio of a content of the 1,2-cyclohexanedione to a content of the 1-hexanoic acid is 0.005 to 5.

[16]

The chemical liquid described in any one of [1] to [15], containing cyclohexanol and 1-hexanoic acid, in which a mass ratio of a content of the cyclohexanol to a content of the 1-hexanoic acid is 0.0005 to 0.5.

[17]

The chemical liquid described in any one of [1] to [16], further containing one or more kinds of second compounds selected from the group consisting of a compound represented by General Formula (4) and a compound represented by General Formula (5), in which a total content of the second compounds is 0.5 to 10 ppm by mass with respect to the total mass of the chemical liquid.

(4)

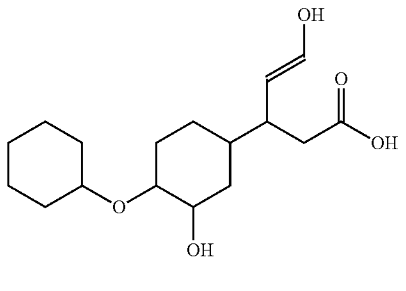

-continued (5)

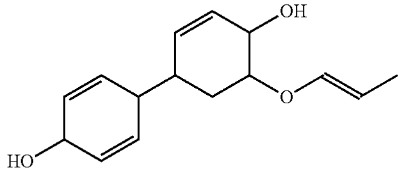

[18]

The chemical liquid described in any one of [1] to [17], further containing a high-boiling-point organic compound having a boiling point of 450° C. or higher, in which a content of the high-boiling-point organic compound is 10 to 1,000 ppb by mass with respect to the total mass of the chemical liquid.

[19]

The chemical liquid described in any one of [1] to [18], further containing one or more kinds of metal components selected from the group consisting of a particulate metal component and an ionic metal component, in which a total content of the metal components is 10 to 350 ppt by mass with respect to the total mass of the chemical liquid.

[20]

The chemical liquid described in [19], containing a Fe-containing particulate metal component having a particle diameter of 15 to 20 nm, and a Pd-containing particulate metal component having a particle diameter of 15 to 20 nm, in which a mass ratio of a content of the Fe-containing particulate metal component having a particle diameter of 15 to 20 nm to a content of the Pd-containing particulate metal component having a particle diameter of 15 to 20 nm is 1 to 23.

[21]

The chemical liquid described in any one of [1] to [20], which is a prewet solution used by being applied to a substrate to be coated with an actinic ray-sensitive or radiation-sensitive resin composition to form a resist film on the substrate, in which the prewet solution is applied before the substrate is coated with the actinic ray-sensitive or radiation-sensitive resin composition.

[22]

A resist pattern forming method, including a prewetting step of coating the substrate with the chemical liquid described in [21], a step of forming a resist film by coating the substrate having undergone the prewetting step with the actinic ray-sensitive or radiation-sensitive resin composition, a step of exposing the resist film, and a step of obtaining a resist pattern by developing the exposed resist film with a developer.

[23]

A semiconductor chip manufacturing method including the resist pattern forming method described in [22].

[24]

A chemical liquid storage body including a container and the chemical liquid described in any one of [1] to [21] that is stored in the container, in which a liquid contact portion coming into contact with the chemical liquid in the container is formed of electropolished stainless steel or a fluororesin.

[25]

The chemical liquid storage body described in [24], in which a void volume in the container determined by Equation (1) is 1% to 20% by volume.

$$\text{void volume}=\{1-(\text{volume of the chemical liquid in the container}/\text{volume of the container})\}\times 100. \quad \text{Equation (1):}$$

[26]

A chemical liquid manufacturing method for obtaining the chemical liquid described in any one of [1] to [21] by purifying a substance to be purified containing cyclohexanone, the method including a distillation step of distilling the substance to be purified.

According to the present invention, it is possible to provide a chemical liquid demonstrating excellent defect inhibition performance in a case where the chemical liquid is used as a prewet solution.

Furthermore, it is possible to provide a resist pattern forming method, a semiconductor chip manufacturing method, a chemical liquid storage body, and a chemical liquid manufacturing method.

DESCRIPTION OF THE PREFERRED EMBODIMENTS

Hereinafter, the present invention will be specifically described.

The following constituents will be described based on typical embodiments of the present invention in some cases, but the present invention is not limited to the embodiments.

In the present specification, the range of numerical values described using "to" means a range including the numerical values listed before and after "to" as the lower limit and the upper limit.

Furthermore, in the present invention, "ppm" means "parts-per-million ($10^{-6}$)", "ppb" means "parts-per-billion ($10^{-9}$)", and "ppt" means "parts-per-trillion ($10^{-12}$)".

In the present invention, regarding the description of a group (atomic group), in a case where whether the group is substituted or unsubstituted is not described, as long as the effects of the present invention are not impaired, the group includes a group which does not contain a substituent and a group which contains a substituent. For example, "hydrocarbon group" includes not only a hydrocarbon group which does not contain a substituent (unsubstituted hydrocarbon group) but also a hydrocarbon group which contains a substituent (substituted hydrocarbon group). The same is true of each compound.

In the present invention, "radiation" means, for example, far ultraviolet, extreme ultraviolet (EUV), X-rays, electron beams, and the like. In addition, in the present invention, light means actinic rays or radiation. In the present invention, unless otherwise specified, "exposure" includes not only exposure by far ultraviolet, X-rays, EUV, and the like, but also lithography by particle beams such as electron beams or ion beams.

[Chemical Liquid]

The chemical liquid according to an embodiment of the present invention is a chemical liquid to be used as a prewet solution and contains cyclohexanone, and one or more kinds of first compounds selected from the group consisting of a compound represented by General Formula (1) that will be described later, a compound represented by General Formula (2) that will be described later, and a compound represented by General Formula (3) that will be described later, in which a content of the cyclohexanone is 98.000% to 99.999% by mass with respect to a total mass of the chemical liquid, a total content of the first compounds is 0.001 to 100 ppm by mass with respect to the total mass of the chemical liquid.

The objects of the present invention are achieved by the chemical liquid according to the embodiment of the present invention constituted as above. The mechanism is unclear, but is assumed to be as below according to the inventors of the present invention.

That is, the inventors consider that in a case where the content of compounds (first compounds) represented by General Formulae (1) to (3), which will be described later, in the chemical liquid containing cyclohexanone is not less than a predetermined amount, the first compounds may interact with residues causing defects, and the residues causing defects may be unlikely to remain on an object to be treated (such as a substrate) that has been treated with the chemical liquid. The inventors also consider that, on the other hand, in a case where the content of the first compounds in the chemical liquid is not more than a predetermined amount, the first compounds and cyclohexanone may be fully compatible with each other, which could inhibit the first compounds from forming residues and causing defects.

In addition, the chemical liquid according to the embodiment of the present invention is also excellent in temporal stability and resist composition-saving performance.

Hereinafter, the components contained in the chemical liquid according to an embodiment of the present invention will be specifically described.

<Cyclohexanone>

The chemical liquid contains cyclohexanone. Cyclohexanone is a compound represented by the following structural formula.

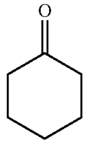

The content of the cyclohexanone in the chemical liquid is 98.000% to 99.999% by mass with respect to the total mass of the chemical liquid. In view of further improving defect inhibition performance, temporal stability, and/or resist composition-saving performance (hereinafter, also simply described as "in view of further improving the effects of the present invention"), the content of the cyclohexanone in the chemical liquid is more preferably 99.000% to 99.990% by mass, and even more preferably 99.300% to 99.900% by mass.

The contents of cyclohexanone and organic components, such as compounds of Formulae 1 to 5, hydroxycyclohexanone, 1,2-cyclohexanedione, cyclohexanol, 1-hexanoic acid, and a high-boiling-point organic compound which will be described later, in the chemical liquid are determined by gas chromatography-mass spectrometry (GC/MS). Specifically, the contents can be measured using GC: 7890B, MS: 5977B, EI/CI MSD manufactured by Agilent Technologies, Inc., and the like.

<First Compounds>

The chemical liquid contains one or more kinds of first compounds selected from the group consisting of a compound represented by General Formula (1) (hereinafter, also called "Formula 1 compound"), a compound represented by General Formula (2) (hereinafter, also called "Formula 2 compound"), and a compound represented by General Formula (3) (hereinafter, also called "Formula 3 compound").

(1)

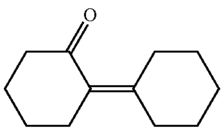

(2)

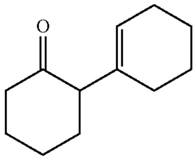

(3)

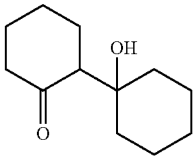

The total content of the first compounds in the chemical liquid (that is, the total content of the Formula 1 compound, the Formula 2 compound, and the Formula 3 compound) is 0.001 to 100 ppm by mass with respect to the total mass of the chemical liquid.

Particularly, in view of further improving the effects of the present invention, the total content of the first compounds is preferably 0.005 to 95 ppm by mass, and more preferably 0.005 to 70 ppm by mass.

The content of the Formula 1 compound with respect to the total mass of the chemical liquid is preferably 0.01 to 95 ppm by mass, and more preferably 0.01 to 70 ppm by mass.

The content of the Formula 2 compound with respect to the total mass of the chemical liquid is preferably 0.001 to 20 ppm by mass, and more preferably 0.001 to 10 ppm by mass.

The content of the Formula 3 compound with respect to the total mass of the chemical liquid is preferably 0.0005 to 10 ppm by mass, and more preferably 0.0005 to 5 ppm by mass.

In the chemical liquid, the mass ratio of the content of the Formula 1 compound to the content of the Formula 2 compound (content of Formula 1 compound/content of Formula 2 compound) is preferably 0.5 to 1,000, and more preferably 1 to 500.

In the chemical liquid, the mass ratio of the content of the Formula 1 compound to the content of the Formula 3 compound (content of Formula 1 compound/content of Formula 3 compound) is preferably 0.5 to 5,000, and more preferably 1 to 3,000.

In the chemical liquid, the mass ratio of the content of the Formula 2 compound to the content of the Formula 3 compound (content of Formula 2 compound/content of Formula 3 compound) is preferably 0.01 to 300, and more preferably 1 to 150.

In a case where these ratios are each within the above range, the effects of the present invention are further improved.

<Hydroxycyclohexanone>

In view of further improving the effects of the present invention, the chemical liquid preferably further contains one or more kinds of hydroxycyclohexanones selected from the group consisting of 2-hydroxycyclohexanone, 3-hydroxycyclohexanone, and 4-hydroxycyclohexanone.

2-Hydroxycyclohexanone, 3-hydroxycyclohexanone, and 4-hydroxycyclohexanone are compounds represented by the following structural Formulae (in order from left).

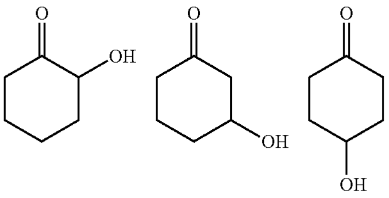

In view of further improving the effects of the present invention, in the chemical liquid, the total content of hydroxycyclohexanones (that is, the total content of 2-hydroxycyclohexanone, 3-hydroxycyclohexanone, and 4-hydroxycyclohexanone) with respect to the total mass of the chemical liquid is preferably 0.001 to 2,500 ppm by mass, and more preferably 0.001 to 1,000 ppm by mass.

The inventors of the present invention consider that in a case where the content of the hydroxycyclohexanones in the chemical liquid is not less than a predetermined amount, the hydroxycyclohexanones may interact with residues causing defects, and the residues causing defects may be unlikely to remain on an object to be treated (such as a substrate) that has been treated with the chemical liquid. The inventors also consider that, on the other hand, in a case where the content of the hydroxycyclohexanones in the chemical liquid is not more than a predetermined amount, the hydroxycyclohexanones and cyclohexanone may be fully compatible with each other, which could inhibit the hydroxycyclohexanones from forming residues and causing defects.

In view of further improving the effects of the present invention, the content of 2-hydroxycyclohexanone with respect to the total mass of the chemical liquid is preferably 0.005 to 1,500 ppm by mass, and more preferably 0.5 to 20 ppm by mass.

The content of 3-hydroxycyclohexanone with respect to the total mass of the chemical liquid is preferably 0.1 to 70 ppm by mass, and more preferably 0.2 to 5 ppm by mass.

The content of 4-hydroxycyclohexanone with respect to the total mass of the chemical liquid is preferably 0.001 to 2,500 ppm by mass, and more preferably 10 to 300 ppm by mass.

In the chemical liquid, the mass ratio of the content of 2-hydroxycyclohexanone to the content of 3-hydroxycyclohexanone (content of 2-hydroxycyclohexanone/content of 3-hydroxycyclohexanone) is preferably 0.005 to 2,000, and more preferably 0.005 to 300.

In the chemical liquid, the mass ratio of the content of 2-hydroxycyclohexanone to the content of 4-hydroxycyclohexanone (content of 2-hydroxycyclohexanone/content of 4-hydroxycyclohexanone) is preferably 0.00001 to 100, and more preferably 0.01 to 15.

In the chemical liquid, the mass ratio of the content of 3-hydroxycyclohexanone to the content of 4-hydroxycyclohexanone (content of 3-hydroxycyclohexanone/content of 4-hydroxycyclohexanone) is preferably 0.00005 to 300, and more preferably 0.003 to 100.

In a case where these ratios are each within the above range, the effects of the present invention are further improved.

<1,2-Cyclohexanedione, cyclohexanol, and 1-hexanoic acid>

In view of further improving the effects of the present invention, the chemical liquid preferably further contains one or more kinds of compounds selected from the group consisting of 1,2-cyclohexanedione, cyclohexanol, and 1-hexanoic acid.

1,2-cyclohexanedione, cyclohexanol, and 1-hexanoic acid are compounds represented by the following structural Formulae (in order from left).

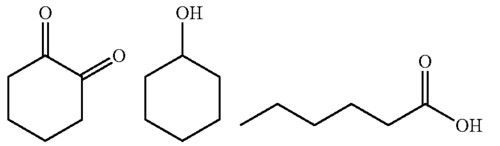

In view of further improving the effects of the present invention, the content of 1,2-cyclohexanedione with respect to the total mass of the chemical liquid is preferably 0.0005 to 1,500 ppm by mass, and more preferably 0.0005 to 40 ppm by mass.

The content of cyclohexanol with respect to the total mass of the chemical liquid is preferably 0.0003 to 75 ppm by mass, and more preferably 0.0003 to 30 ppm by mass.

The content of 1-hexanoic acid with respect to the total mass of the chemical liquid is preferably 0.0005 to 2,500 ppm by mass, and more preferably 5 to 600 ppm by mass.

The inventors of the present invention consider that in a case where the content of the above compound (1,2-cyclohexanedione, cyclohexanol, or 1-hexanoic acid) in the chemical liquid is not less than a predetermined amount, the compound may interact with residues causing defects, and the residues causing defects may be unlikely to remain on an object to be treated (such as substrate) that has been treated with the chemical liquid. The inventors also consider that, on the other hand, in a case where the content of the compound in the chemical liquid is not more than a predetermined amount, the compound and cyclohexanone may be fully compatible with each other, which could inhibit the compound from forming residues and causing defects.

In the chemical liquid, the mass ratio of the content of 1,2-cyclohexanedione to the content of cyclohexanol (content of 1,2-cyclohexanedione/content of cyclohexanol) is preferably 0.01 to 3,000, and more preferably 0.2 to 400.

In the chemical liquid, the mass ratio of the content of 1,2-cyclohexanedione to the content of 1-hexanoic acid (content of 1,2-cyclohexanedione/content of 1-hexanoic acid) is preferably 0.05 to 100, and more preferably 0.005 to 5.

In the chemical liquid, the mass ratio of the content of cyclohexanol to the content of 1-hexanoic acid (content of cyclohexanol/content of 1-hexanoic acid) is preferably 0.00005 to 50, and more preferably 0.0005 to 0.5.

In a case where these ratios are each within the above range, the effects of the present invention are further improved.

<Second Compounds>

In view of further improving the effects of the present invention, the chemical liquid preferably further contains one or more kinds of second compounds selected from the group consisting of a compound represented by General Formula (4) (hereinafter, also called "Formula 4 compound") and a compound represented by General Formula (5) (hereinafter, also called "Formula 5 compound").

(4)

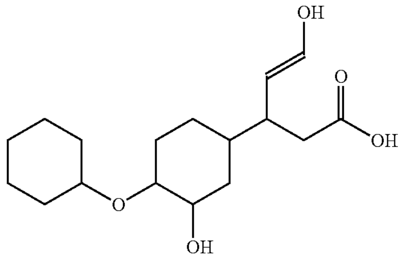

(5)

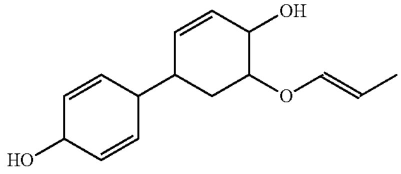

In view of further improving the effects of the present invention, in the chemical liquid, the total content of the second compounds (total content of the Formula 4 compound and the Formula 5 compound) with respect to the total mass of the chemical liquid is preferably 0.0001 to 1,500 ppm by mass, and more preferably 0.5 to 10 ppm by mass.

The inventors of the present invention consider that in a case where the content of the second compounds in the chemical liquid is not less than a predetermined amount, the second compounds may interact with residues causing defects, and the residues causing defects may be unlikely to remain on an object to be treated (such as a substrate) that has been treated with the chemical liquid. The inventors also consider that, on the other hand, in a case where the content of the second compounds in the chemical liquid is not more than a predetermined amount, the second compounds and cyclohexanone may be fully compatible with each other, which could inhibit the second compounds from forming residues and causing defects.

In view of further improving the effects of the present invention, the content of the Formula 4 compound with respect to the total mass of the chemical liquid is preferably 0.0001 to 1,500 ppm by mass, and more preferably 0.0001 to 5 ppm by mass.

The content of the Formula 5 compound with respect to the total mass of the chemical liquid is preferably 0.0001 to 100 ppm by mass, and more preferably 0.0001 to 6 ppm by mass.

<High-Boiling-Point Organic Compound>

In view of further improving the effects of the present invention, the chemical liquid preferably contains a high-boiling-point organic compound having a boiling point of 450° C. or higher. The high-boiling-point organic compound is a compound other than cyclohexanone derivatives (compounds of Formulae 1 to 5, hydroxycyclohexanone, 1,2-cyclohexanedione, cyclohexanol, and 1-hexanoic acid).

The boiling point in the present specification means a boiling point under the standard atmospheric pressure.

In view of further improving the effects of the present invention, in the chemical liquid, the content (total content) of the high-boiling-point organic compound with respect to the total mass of the chemical liquid is preferably 0.001 to 1,500 ppb by mass, and more preferably 10 to 1,000 ppb by mass.

Presumably, in a case where the content of the high-boiling-point organic compound in the chemical liquid is not less than a predetermined amount, the chemical liquid may behave like a saturated solution, and impurities (particularly, impurities that easily cause defects) may be less likely to be mixed into the chemical liquid. Furthermore, presumably, in a case where the content of the high-boiling-point organic compound is not more than a predetermined amount, the high-boiling-point organic compound may be unlikely to cause defects.

The chemical liquid may contain only one kind of high-boiling-point organic compound or two or more kinds of high-boiling-point organic compounds.

<Metal Components>

The chemical liquid may contain one or more kinds of metal components selected from the group consisting of a particulate metal component (metal particles) and an ionic metal component (metal ions).

In the present invention, the content of metal components means the total content of metal particles and metal ions.

The chemical liquid may contain either or both of metal particles and metal ions.

Examples of metal elements in the metal components include Na (sodium), K (potassium), Ca (calcium), Fe (iron), Cu (copper), Mg (magnesium), Mn (manganese), Li (lithium), Al (aluminum), Cr (chromium), Ni (nickel), Ti (titanium), Zr (zirconium), and Pd (palladium). The metal components may contain only one kind of metal element or two or more kinds of metal elements.

The metal particles may be a simple metal, an alloy, or another metal compound. Alternatively, the metal particles may be in the form of aggregates of a metal (including a metal compound) and an organic substance.

The metal ions may be in the form of simple metal ions or complex ions (for example, an ammine complex, a cyano complex, a halogeno complex, a hydroxyl complex, and the like).

The metal components may be metal components that are inevitably incorporated into the chemical liquid during the manufacturing, storage, and/or transfer of the chemical liquid, or may be intentionally added.

In a case where the chemical liquid contains the metal components, the content of the metal components is not particularly limited. For example, the content of the metal components with respect to the total mass of the chemical liquid is preferably 0.01 to 500 ppt by mass, and more preferably 10 to 350 ppt by mass.

Presumably, in a case where the content of the metal components (particularly, predetermined metal particles which will be described later) is not less than a predetermined amount, an organic compound (particularly, a polar organic compound) that the chemical liquid can contain is likely to be inhibited from aggregating in the form of particles and causing defects on a substrate or the like.

Furthermore, presumably, in a case where the content of the metal components is not more than a predetermined amount, it may be easy to avoid the increase of occurrence of defects derived from the metal components.

In a case where the chemical liquid contains metal particles, in view of further improving the effects of the present invention, the content of the metal particles with respect to the total mass of the chemical liquid is preferably 0.01 to 300 ppt by mass, and more preferably 1 to 250 ppt by mass.

Particularly, it is preferable that the chemical liquid contain metal particles having a particle diameter of 15 to 20 nm.

For example, it is preferable that the chemical liquid contain Fe-containing metal particles (Fe-containing particulate metal component) and/or Pd-containing metal particles (Pd-containing particulate metal component) as metal particles.

In view of further improving the effects of the present invention, in the chemical liquid, the content of Fe-containing metal particles having a particle diameter of 15 to 20 nm with respect to the total mass of the chemical liquid is preferably 1 to 200 ppt by mass, and more preferably 2 to 100 ppt by mass.

In the chemical liquid, the content of Pd-containing metal particles having a particle diameter of 15 to 20 nm with respect to the total mass of the chemical liquid is preferably 0.01 to 10 ppt by mass, and more preferably 0.05 to 1 ppt by mass.

In the chemical liquid, the mass ratio of the content of Fe-containing metal particles having a particle diameter of 15 to 20 nm to the content of Pd-containing metal particles having a particle diameter of 15 to 20 nm (content of Fe-containing metal particles having a particle diameter of 15 to 20 nm/content of Pd-containing metal particles having a particle diameter of 15 to 20 nm) is preferably 0.5 to 50, and more preferably 1 to 23.

In a case where there are particles containing multiple kinds of metals, the particles are divided according to the mass ratio of metals contained, and particles containing each metal are regarded as present.

Specifically, for example, for composite metal particles containing three kinds of metals X, Y, and Z at x % by mass, y % by mass, and z % by mass respectively, "X-containing metal particles", "Y-containing metal particles", and "Z-containing metal particles" are each regarded as present in mass calculated by the following equation.

$$\text{Mass of } X\text{-containing metal particles} = \text{mass of composite metal particles} \times x \div (x+y+z)$$

$$\text{Mass of } Y\text{-containing metal particles} = \text{mass of composite metal particles} \times y \div (x+y+z)$$

$$\text{Mass of } Z\text{-containing metal particles} = \text{mass of composite metal particles} \times z \div (x+y+z)$$

In a case where the chemical liquid contains metal ions, in view of further improving the effects of the present invention, the content of the metal ions with respect to the total mass of the chemical liquid is preferably 0.01 to 300 ppt by mass, and more preferably 2 to 250 ppt by mass.

The type, particle diameter, and content of the metal particles and the type and content of the metal ions in the chemical liquid can be measured by Single Nano Particle Inductively Coupled Plasma Mass Spectrometry (SP-ICP-MS).

The device used in SP-ICP-MS is the same as the device used in general inductively coupled plasma mass spectrometry (ICP-MS). The only difference between SP-ICP-MS and ICP-MS is how to analyze data. With SP-ICP-MS, data can be analyzed using commercial software.

With ICP-MS, the content of a metal component as a measurement target is measured regardless of the way the metal component is present. Accordingly, the total mass of metal particles and metal ions as a measurement target is quantified as the content of the metal component.

With SP-ICP-MS, the content of metal particles can be measured. Accordingly, by subtracting the content of the metal particles from the content of the metal component in a sample, the content of metal ions in the sample can be calculated.

Examples of the device for SP-ICP-MS include Agilent 8800 triple quadrupole inductively coupled plasma mass spectrometry (ICP-MS, for semiconductor analysis, option #200) manufactured by Agilent Technologies, Inc. By using this device, the content of the metal-containing particles can be measured by the method described in Examples. In addition to the device described above, it is possible to use NexION350S manufactured by PerkinElmer Inc. and Agilent 8900 manufactured by Agilent Technologies, Inc.

<Water>

The chemical liquid may contain water in addition to the above.

In a case where the chemical liquid contains water, in view of further improving the effects of the present invention, the content of water with respect to the total mass of the chemical liquid is preferably 1 to 3,000 ppm by mass, and more preferably 10 to 500 ppm by mass.

<Chemical Liquid Manufacturing Method>

The method for manufacturing the aforementioned chemical liquid is not particularly limited, and examples thereof include known manufacturing methods.

For example, the chemical liquid having a predetermined composition may be manufactured by purchasing a commercially available product and performing a purification treatment on the product. Furthermore, the chemical liquid may be manufactured by adding predetermined amounts of the aforementioned first compounds (and other components as desired) to cyclohexanone.

Among these, as a chemical liquid manufacturing method, a method of purifying a substance to be purified containing cyclohexanone (such as commercially available cyclohexanone) to obtain a chemical liquid is preferable. As the purification method, a method including at least one of a distillation step of distilling the substance to be purified or a filtration step of filtering the substance to be purified is preferable, a method including at least the distillation step is more preferable, and a method including both the distillation step and filtration step is even more preferable.

The first compounds are often generated in the process of distilling cyclohexanone. Therefore, in the commercially available cyclohexanone that has not undergone a sufficient distillation step, the content of the first compounds is often less than a predetermined amount.

Therefore, the chemical liquid according to the embodiment of the present invention may be obtained by distilling a substance to be purified containing cyclohexanone under predetermined conditions so that the content of the first compounds in the obtained chemical liquid is adjusted.

Hereinafter, the procedures of the distillation step and the filtration step will be specifically described.

(Distillation Step)

The distillation step is a step of distilling a substance to be purified (such as a solution containing cyclohexanone) so as to obtain a distilled substance to be purified.

By the distillation step, impurities in the substance to be purified can be reduced, and at the same time, the first compounds are generated.

The components removed by the distillation step are not particularly limited, and examples thereof include water.

In the substance to be purified subjected to the distillation step, the content of cyclohexanone is preferably 98.000% to 99.999% by mass with respect to the total mass of the substance to be purified.

Furthermore, the substance to be purified preferably contains a predetermined amount of water. Water is considered to act as a catalyst for generating the first compounds in the substance to be purified subjected to the distillation step. In view of adjusting the content of the first compounds in the obtained chemical liquid, the content of water (water content) with respect to the total mass of the substance to be purified is preferably 1 to 5,000 ppm by mass, and more preferably 5 to 1,000 ppm by mass.

The method of distilling the substance to be purified is not particularly limited, and known methods can be used. Typically, examples thereof include a method of disposing a distillation column on a primary side of the purification device used in the filtration step, which will be described later, and introducing the distilled substance to be purified into a manufacturing tank.

At this time, the liquid contact portion of the distillation column is not particularly limited, but is preferably formed of the anticorrosive material which will be described later.

In the distillation step, the substance to be purified may be passed through the same distillation column multiple times, or the substance to be purified may be passed through different distillation columns. In a case where the substance to be purified is passed through different distillation columns, for example, a method may be used in which a rough distillation treatment is performed to remove low-boiling-point components and the like by passing the substance to be purified through a distillation column and then a fractionation treatment is performed to remove other components by passing the substance to be purified through a distillation column different from the distillation column used in the rough distillation treatment.

Examples of the distillation column include a plate distillation column and a pressure-reducing plate distillation column.

The number of theoretical plates of the distillation column is preferably 5 to 35, for example.

Furthermore, in order to satisfy both the thermal stability and purification accuracy during distillation, distillation under reduced pressure may also be performed in some or all of the plates.

(Filtration Step)

The filtration step is a step of filtering the aforementioned substance to be purified by using a filter.

The method of filtering the substance to be purified by using a filter is not particularly limited. However, it is preferable to use a method of passing the substance to be purified through a filter unit (letting the substance to be purified run through a filter unit) including a housing and a filter cartridge stored in the housing under pressure or under no pressure.

The pore size of the filter is not particularly limited, and a filter having a pore size that is generally used for filtering the substance to be purified can be used. Especially, the pore size of the filter is preferably 200 nm or less, more preferably 20 nm or less, and even more preferably 10 nm or less. The lower limit thereof is not particularly limited. From the viewpoint of productivity, the lower limit is preferably 1 nm or more in general.

In the present specification, the pore size of a filter means a pore size determined by the bubble point of isopropanol.

Two or more filters (for example, 2 to 8 filters) may be used. In this case, the materials and/or pore sizes of the plurality of filters may be the same as or different from each other. In addition, recirculation filtration may be performed in which a liquid to be purified is passed through the same filter more than once. In this case, the recirculation filtration may be performed in some or all of the filters used for filtering the liquid to be purified.

The way the two or more kinds of filters having different pore sizes are used in order is not particularly limited. For example, a method may be used in which a plurality of filter units including filters is arranged along a pipe line through which the substance to be purified is transferred. At this time, in a case where an attempt is made to set the flow rate of the substance to be purified per unit time to be constant throughout the entire pipe line, sometimes the pressure applied to a filter having a smaller pore size is higher than the pressure applied to a filter having a larger pore size. In this case, it is preferable to dispose a pressure control valve, a damper, or the like between the filters such that constant pressure is applied to the filter having a smaller pore size, or to arrange filter units housing the same filters in a row along the pipe line such that the filtration area is enlarged.

The material of the filter is not particularly limited, and examples thereof include materials known as filter materials. Specifically, examples of the material of the filter include a resin-like polyamide such as nylon (for example, 6-nylon and 6,6-nylon); polyolefin such as polyethylene and polypropylene; polystyrene; polyimide; polyamide imide; poly(meth)acrylate; a fluororesin such as polytetrafluoroethylene, perfluoroalkoxyalkane, a perfluoroethylene propene copolymer, an ethylene-tetrafluoroethylene copolymer, an ethylene-chlorotrifluoroethylene copolymer, polychlorotrifluoroethylene, polyvinylidene fluoride, and polyvinyl fluoride; polyvinyl alcohol; polyester; cellulose; cellulose acetate, and the like.

Among these, at least one kind of resin selected from the group consisting of nylon (particularly preferably 6,6-nylon), polyolefin (particularly preferably polypropylene or polyethylene), poly(meth)acrylate, and a fluororesin (particularly preferably polytetrafluoroethylene (PTFE) or perfluoroalkoxyalkane (PFA)) is preferable, because this resin has higher solvent resistance and makes it possible to obtain a chemical liquid having further improved defect inhibition performance. One kind of each of these polymers can be used singly, or two or more kinds of these polymers can be used in combination.

In addition to the resin, diatomite, glass, and the like may be used.

Furthermore, a polymer (such as nylon-grafted UPE) obtained by bonding polyamide (for example, nylon such as nylon-6 or nylon-6,6) to polyolefin (such as UPE (ultra-high-molecular-weight polyethylene) which will be described later) by graft copolymerization may be used as the material of the filter.

Furthermore, the filter may be a filter having undergone a surface treatment. The surface treatment method is not particularly limited, and known methods can be used. Examples of the surface treatment method include a chemical modification treatment, a plasma treatment, a hydrophobization treatment, coating, a gas treatment, sintering, and the like.

As the chemical modification treatment, a method of introducing ion exchange groups into the filter is preferable.

That is, as the filter, a filter having ion exchange groups may be used.

Examples of the ion exchange groups include cation exchange groups and anion exchange groups. Examples of the cation exchange groups include a sulfonic acid group, a carboxyl group, and a phosphoric acid group. Examples of the anion exchange groups include a quaternary ammonium group. The method of introducing ion exchange groups into the filter is not particularly limited, and examples thereof include a method of reacting a compound containing ion exchange groups and polymerizable groups with the filter (typically, a method of grafting the compound on the filter).

The method of introducing the ion exchange groups is not particularly limited. For example, the filter is irradiated with ionizing radiation (such as α-rays, β-rays, γ-rays, X-rays, or electron beams) so that active portions (radicals) are generated. After being irradiated, the filter is immersed in a monomer-containing solution so that the monomer is graft-polymerized with the filter. As a result, the polymer obtained by the polymerization of the monomer is grafted on the filter. By bringing the generated polymer into contact with a compound containing anion exchange groups or cation exchange groups so that a reaction occurs, ion exchange groups can be introduced into the polymer.

In a case where the filter containing ion exchange groups is used, the content of metal particles and metal ions in the chemical liquid is more easily controlled within a desired range. The material constituting the filter having ion exchange groups is not particularly limited, and examples thereof include materials obtained by introducing ion exchange groups into a fluororesin and a polyolefin. Among these, the material obtained by introducing ion exchange groups into a fluororesin is more preferable.

The pore size of the filter containing ion exchange groups is not particularly limited, but is preferably 1 to 30 nm and more preferably 5 to 20 nm.

As the filter used in the filtration step, two or more kinds of filters made of different materials may be used. For example, two or more kinds of filters may be used which are selected from the group consisting of filters made of a polyolefin, a fluororesin, polyamide, and a material obtained by introducing ion exchange groups into these materials.

The pore structure of the filter is not particularly limited, and may be appropriately selected depending on the components in the substance to be purified. In the present specification, the pore structure of the filter means a pore size distribution, a positional distribution of pores in the filter, a pore shape, and the like. Typically, the pore structure can be controlled by the filter manufacturing method.

For example, in a case where powder of a resin or the like is sintered to form a filter, a porous membrane is obtained. Furthermore, in a case where a method such as electrospinning, electroblowing, or melt blowing is used to form a filter, a fiber membrane is obtained. These have different pore structures.

“Porous membrane” means a membrane which retains components in a substance to be purified, such as gel, particles, colloids, cells, and oligomers, but allows the components substantially smaller than the pores of the membrane to pass through the membrane. The retention of components in the substance to be purified by the porous membrane depends on operating conditions, for example, the surface velocity, the use of a surfactant, the pH, and a combination of these in some cases. Furthermore, the retention of components can depend on the pore size and structure of the porous membrane, and the size and structure of particles supposed to be removed (such as whether the particles are hard particles or gel).

The pore structure of the porous membrane (for example, a porous membrane including UPE, PTFE, and the like) is not particularly limited. The pores have, for example, a lace shape, a string shape, a node shape, and the like.

The size distribution of pores in the porous membrane and the positional distribution of pore size in the membrane are not particularly limited. The size distribution may be narrower, and the positional distribution of pore size in the membrane may be symmetric. Furthermore, the size distribution may be wider, and the positional distribution of pore size in the membrane may be asymmetric (this membrane is also called "asymmetric porous membrane"). In the asymmetric porous membrane, the size of the holes changes in the membrane. Typically, the pore size increases toward the other surface of the membrane from one surface of the membrane. In this case, the surface with many pores having a large pore size is called "open side", and the surface with many pores having a small pore size is also called "tight side".

Examples of the asymmetric porous membrane include a membrane in which the pore size is minimized at a position in the thickness direction of the membrane (this is also called "hourglass shape").

It is preferable that the filters be used after being thoroughly washed before use.

In a case where an unwashed filter (or a filter that has not been thoroughly washed) is used, the impurities contained in the filter are easily mixed into the chemical liquid.

As described above, the filtration step according to an embodiment of the present invention may be a multi-stage filtration step in which the substance to be purified is passed through two or more kinds of different filters. The different filters mean filters different from each other in terms of at least one of the pore size, pore structure, or material.

Furthermore, the substance to be purified may be passed through the same filter multiple times or passed through a plurality of filters of the same type.

In addition, in view of ease of manufacturing the chemical liquid according to an embodiment of the present invention, it is preferable to use a fluororesin-containing filter. The fluororesin-containing filter is particularly preferably for multi-stage filtration using a plurality of filters. As the fluororesin-containing filter, a filter having a pore size of 20 nm or less is preferable.

Especially, in view of ease of manufacturing the chemical liquid according to an embodiment of the present invention, it is preferable to perform a first filtration step of filtering a substance to be purified by using a filter having a pore size of 100 nm or more and a second filtration step of filtering the substance to be purified by using a fluororesin-containing filter (preferably a filter made of PTFE) having a pore size of 10 nm or less in this order. In the first filtration step, coarse particles are removed.

The material of a liquid contact portion of the purification device used in the filtration step is not particularly limited (the liquid contact portion means an inner wall surface or the like that is likely to come into contact with the substance to be purified and the chemical liquid). However, it is preferable that the liquid contact portion be formed of at least one kind of material selected from the group consisting of a nonmetallic material (such as a fluororesin) and an electropolished metallic material (such as stainless steel) (hereinafter, these materials will be collectively called "anticorrosive material").

The aforementioned nonmetallic material is not particularly limited, and examples thereof include known materials.

Examples of the nonmetallic material include at least one kind of material selected from the group consisting of a polyethylene resin, a polypropylene resin, a polyethylene-polypropylene resin, and a fluororesin (for example, polytetrafluoroethylene, a polytetrafluoroethylene-perfluoroalkyl vinyl ether copolymer resin, a polytetrafluoroethylene-hexafluoropropylene copolymer resin, a polytetrafluoroethylene-ethylene copolymer resin, a chlorotrifluoroethylene-ethylene copolymer resin, a vinylidene fluoride resin, a chlorotrifluoroethylene copolymer resin, a vinyl fluoride resin, and the like).

The aforementioned metallic material is not particularly limited, and examples thereof include known materials.

Examples of the metallic material include a metallic material in which the total content of chromium and nickel is greater than 25% by mass with respect to the total mass of the metallic material. The total content of chromium and nickel is more preferably 30% by mass or more. The upper limit of the total content of chromium and nickel in the metallic material is not particularly limited, but is preferably 90% by mass or less in general.

Examples of the metallic material include stainless steel and a nickel-chromium alloy.

The stainless steel is not particularly limited, and examples thereof include known stainless steel. Among these, an alloy with a nickel content of 8% by mass or more is preferable, and austenite-based stainless steel with a nickel content of 8% by mass or more is more preferable. Examples of the austenite-based stainless steel include Steel Use Stainless (SUS) 304 (Ni content: 8% by mass, Cr content: 18% by mass), SUS304L (Ni content: 9% by mass, Cr content: 18% by mass), SUS316 (Ni content: 10% by mass, Cr content: 16% by mass), SUS316L (Ni content: 12% by mass, Cr content: 16% by mass), and the like.

The nickel-chromium alloy is not particularly limited, and examples thereof include known nickel-chromium alloys. Among these, a nickel-chromium alloy is preferable in which the nickel content is 40% to 75% by mass and the chromium content is 1% to 30% by mass.

Examples of the nickel-chromium alloy include HASTELLOY (trade name, the same is true of the following description), MONEL (trade name, the same is true of the following description), and INCONEL (trade name, the same is true of the following description). More specifically, examples thereof include HASTELLOY C-276 (Ni content: 63% by mass, Cr content: 16% by mass), HASTELLOY C (Ni content: 60% by mass, Cr content: 17% by mass), and HASTELLOY C-22 (Ni content: 61% by mass, Cr content: 22% by mass).

Furthermore, if necessary, the nickel-chromium alloy may further contain boron, silicon, tungsten, molybdenum, copper, cobalt, and the like in addition to the aforementioned alloy.

The method of electropolishing the metallic material is not particularly limited, and known methods can be used. For example, it is possible to use the methods described in paragraphs "0011" to "0014" in JP2015-227501A, paragraphs "0036" to "0042" in JP2008-264929A, and the like.

Presumably, in a case where the metallic material is electropolished, the chromium content in a passive layer on the surface thereof may be higher than the chromium content in the parent phase. Therefore, presumably, in a case where a purification device having a liquid contact portion formed of the electropolished metallic material is used, metal particles may be hardly eluted into the substance to be purified.

The metallic material may have undergone buffing. As the buffing method, known methods can be used without particular limitation. The size of abrasive grains used for finishing the buffing is not particularly limited, but is preferably #400 or less because such grains make it easy to further reduce the surface asperity of the metallic material. The buffing is preferably performed before the electropolishing.

During the purification of the substance to be purified, it is preferable that all of the opening of a container, washing of a container and a device, storage of a solution, analysis, and the like that included in the purification be performed in a clean room. It is preferable that the clean room have a cleanliness equal to or higher than Class 4 specified in the international standard ISO14644-1:2015 established by International Organization for Standardization. Specifically, the clean room preferably meets any of ISO Class 1, ISO Class 2, ISO Class 3, or ISO Class 4, more preferably meets ISO Class 1 or ISO Class 2, and even more preferably meets ISO Class 1.

One of the examples of suitable aspects of the chemical liquid manufacturing method according to an embodiment of the present invention is a manufacturing method including, in the following order, a step of distilling a cyclohexanone-containing substance to be purified so as to obtain a distilled substance to be purified, a first filtration step of filtering the distilled substance to be purified by using a filter having a pore size of 100 nm or more, and a second filtration step of filtering a substance to be purified obtained through the first filtration step by using a fluororesin-containing filter (preferably a filter made of PTFE) having a pore size of 10 nm or less.

<Chemical Liquid Storage Body>

The chemical liquid may be stored in a container and kept as it is until use. The container and the chemical liquid stored in the container are collectively called chemical liquid storage body. The preserved chemical liquid is used after being taken out of the chemical liquid storage body.

As the container storing the chemical liquid, a container for manufacturing semiconductor devices is preferable which has a high internal cleanliness and hardly causes elution of impurities.

The container that can be used is not particularly limited, and examples thereof include a "CLEAN BOTTLE" series manufactured by AICELLO CORPORATION, "PURE BOTTLE" manufactured by KODAMA PLASTICS Co., Ltd., and the like.

As the container, for the purpose of preventing mixing of impurities into the chemical liquid (contamination), it is also preferable to use a multilayer bottle in which the inner wall of the container has a 6-layer structure formed of 6 kinds of resins or a multilayer bottle having a 7-layer structure formed of 6 kinds of resins. Examples of these containers include the containers described in JP2015-123351A.

The liquid contact portion coming into contact with the chemical liquid in the container may be the aforementioned anticorrosive material (preferably electropolished stainless steel or a fluororesin such as PFA) or glass. In view of further improving the effects of the present invention, it is preferable that 90% or more of the area of the liquid contact portion be formed of the above material. It is more preferable that the entirety of the liquid contact portion be formed of the above material.

The void volume in the container of the chemical liquid storage body is preferably 0.5% to 35% by volume, and more preferably 1% to 20% by volume. That is, in the method for manufacturing the chemical liquid storage body according to an embodiment of the present invention, it is preferable to perform a storage step of storing the obtained chemical liquid in the container so that the void volume in the container is 0.5% to 35% by volume.

The void volume is calculated according to Equation (1).

$$\text{void volume}=\{1-(\text{volume of chemical liquid in container}/\text{container volume})\}\times 100 \quad \text{Equation (1):}$$

The container volume has the same definition as the internal volume (capacity) of the container.

In a case where the void volume is set within the above range, the contaminants such as impurities are inhibited, and storage stability can be ensured.

<Use of Chemical Liquid>

The chemical liquid according to the embodiment of the present invention is used as a prewet solution used for prewetting.

The chemical liquid according to the embodiment of the present invention is particularly preferably a prewet solution used for manufacturing semiconductor devices (preferably a semiconductor chip).

For example, in a case where a surface of an object to be treated (preferably a surface of a substrate) is to be coated with a specific liquid (preferably an actinic ray-sensitive or radiation-sensitive resin composition used to form a resist film for obtaining a resist pattern as will be described later), prewetting is performed which is a treatment of coating the surface of the object to be treated with another liquid (prewet solution) immediately before the object is coated with the specific liquid, so that the surface of the object to be treated is easily uniformly coated with the specific liquid.

In other words, the chemical liquid according to the embodiment of the present invention is preferably a prewet solution used by being applied to a substrate to be coated with an actinic ray-sensitive or radiation-sensitive resin composition to form a resist film on the substrate, before the substrate is coated with the actinic ray-sensitive or radiation-sensitive resin composition.

The chemical liquid according to the embodiment of the present invention is preferably used as a prewet solution in forming a resist pattern.

In a suitable aspect, for example, the chemical liquid according to the embodiment of the present invention is used as a prewet solution in a resist pattern forming method having the following Steps 1 to 4 performed in this order.

Step 1: Step of coating substrate with chemical liquid (prewetting step)

Step 2: Step of forming coating film (resist film) by coating substrate with actinic ray-sensitive or radiation-sensitive resin composition (resist film forming step)

Step 3: Step of exposing coating film (resist film)

Step 4: Step of obtaining resist pattern by developing exposed resist film with developer (development step)

Hereinafter, Steps 1 to 4 will be specifically described.

(Step 1)

Step 1 is a step of coating a substrate with the chemical liquid (prewetting step).

The method of coating the substrate with the chemical liquid is not particularly limited, and spin coating is particularly preferable.

The type of substrate is not particularly limited, and examples thereof include a silicon substrate and a silicon substrate coated with silicon dioxide.

An antireflection film or the like may be formed on the substrate.

(Step 2)

Step 2 is a step of forming a coating film (resist film) on the substrate by coating the substrate with an actinic ray-sensitive or radiation-sensitive resin composition (hereinafter, also called "resist composition") (resist film forming step).

Spin coating is preferable as a coating method for coating a predetermined substrate with the resist composition.

The thickness of the resist film is not particularly limited. In view of making it possible to form a fine resist pattern with higher accuracy, the thickness of the resist film is preferably 10 to 200 nm.

It is preferable that the resist composition contain a resin having a group which is decomposed by the action of an acid and generates a polar group (acid-decomposable resin) (hereinafter, this resin will be also called "resin P"). As the resin P, a resin having a repeating unit represented by Formula (AI) that will be described later is more preferable, which is a resin whose solubility in a developer containing an organic solvent as a main component is reduced by the action of an acid. The resin having a repeating unit represented by Formula (AI), which will be described later, has a group that is decomposed by the action of an acid and generates an alkali-soluble group (hereinafter, also called "acid-decomposable group").

Examples of the polar group include an alkali-soluble group. Examples of the alkali-soluble group include a carboxyl group, a fluorinated alcohol group (preferably a hexafluoroisopropanol group), a phenolic hydroxyl group, and a sulfo group.

In the acid-decomposable group, the polar group is protected with a group dissociated by an acid (acid-dissociable group). Examples of the acid-dissociable group include $-C(R_{36})(R_{37})(R_{38})$, $-C(R_{36})(R_{37})(OR_{39})$, and $-C(R_{01})(R_{02})(OR_{39})$.

In the formulae, $R_{36}$ to $R_{39}$ each independently represent an alkyl group, a cycloalkyl group, an aryl group, an aralkyl group, or an alkenyl group. $R_{36}$ and $R_{37}$ may be bonded to each other to form a ring.

$R_{01}$ and $R_{02}$ each independently represent a hydrogen atom, an alkyl group, a cycloalkyl group, an aryl group, an aralkyl group, or an alkenyl group.

It is preferable that the resin P contain a repeating unit represented by Formula (AI).

(AI)

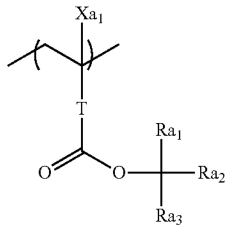

In Formula (AI), $Xa_1$ represents a hydrogen atom or an alkyl group which may have a substituent.

T represents a single bond or a divalent linking group.

$Ra_1$ to $Ra_3$ each independently represent an alkyl group (linear or branched) or a cycloalkyl group (monocyclic or polycyclic).

Two out of $Ra_1$ to $Ra_3$ may be bonded to each other to form a cycloalkyl group (monocyclic or polycyclic).

Examples of the alkyl group which is represented by $Xa_1$ and may have a substituent include a methyl group and a group represented by $-CH_2-R_{11}$. $R_{11}$ represents a halogen atom (such as a fluorine atom), a hydroxyl group, or a monovalent organic group.

$Xa_1$ is preferably a hydrogen atom, a methyl group, a trifluoromethyl group, or a hydroxymethyl group.

Examples of the divalent linking group represented by T include an alkylene group, a —COO-Rt- group, a —O-Rt- group, and the like. In the formulae, Rt represents an alkylene group or a cycloalkylene group.

T is preferably a single bond or a —COO-Rt- group. Rt is preferably an alkylene group having 1 to 5 carbon atoms, and more preferably a $-CH_2-$ group, a $-(CH_2)_2-$ group, or a $-(CH_2)_3-$ group.

The alkyl group represented by $Ra_1$ to $Ra_3$ is preferably an alkyl group having 1 to 4 carbon atoms.

The cycloalkyl group represented by $Ra_1$ to $Ra_3$ is preferably a monocyclic cycloalkyl group such as a cyclopentyl group or a cyclohexyl group or a polycyclic cycloalkyl group such as a norbornyl group, a tetracyclodecanyl group, a tetracyclododecanyl group, or an adamantyl group.

The cycloalkyl group formed by the bonding of two groups out of $Ra_1$ to $Ra_3$ is preferably a monocyclic cycloalkyl group such as a cyclopentyl group and a cyclohexyl group or a polycyclic cycloalkyl group such as a norbornyl group, a tetracyclodecanyl group, a tetracyclododecanyl group, and an adamantyl group, and more preferably a monocyclic cycloalkyl group having 5 or 6 carbon atoms.

In the cycloalkyl group formed by the bonding of two groups out of $Ra_1$ to $Ra_3$, for example, one methylene group constituting the ring may be substituted with a heteroatom such as an oxygen atom or a group having a heteroatom such as a carbonyl group.

As the repeating unit represented by Formula (AI), for example, an aspect is preferable in which $Ra_1$ is a methyl group or an ethyl group, and $Ra_2$ and $Ra_3$ are bonded to each other to form the aforementioned cycloalkyl group.

Each of the above groups may have a substituent. Examples of the substituent include an alkyl group (having 1 to 4 carbon atoms), a halogen atom, a hydroxyl group, an alkoxy group (having 1 to 4 carbon atoms), a carboxyl group, an alkoxycarbonyl group (having 2 to 6 carbon atoms), and the like. As the substituent, a substituent having 8 or less carbon atoms is preferable.

The content of the repeating unit represented by Formula (AI) with respect to all the repeating units in the resin P is preferably 20 to 90 mol %, more preferably 25 to 85 mol %, and even more preferably 30 to 80 mol %.

It is preferable that the resin P contain a repeating unit Q having a lactone structure.

The repeating unit Q having a lactone structure preferably has a lactone structure on a side chain. The repeating unit Q is more preferably a repeating unit derived from a (meth) acrylic acid derivative monomer.

One kind of repeating unit Q having a lactone structure may be used singly, or two or more kinds of repeating units Q may be used in combination. It is preferable to use one kind of repeating unit Q.

The content of the repeating unit Q having a lactone structure with respect to all the repeating units in the resin P is preferably 3 to 80 mol %, and more preferably 3 to 60 mol %.

The lactone structure is preferably a 5- to 7-membered lactone structure, and more preferably a structure in which another ring structure is fused with a 5- to 7-membered lactone structure by forming a bicyclo structure or a spiro structure.

It is preferable that the lactone structure have a repeating unit having a lactone structure represented by any of Formulae (LC1-1) to (LC1-17). As the lactone structure, a lactone structure represented by Formula (LC1-1), Formula (LC1-4), Formula (LC1-5), or Formula (LC1-8) is preferable, and a lactone structure represented by Formula (LC1-4) is more preferable.

LC1-1
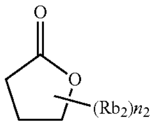
LC1-2
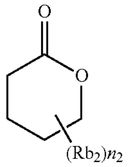
LC1-3
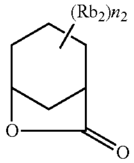
LC1-4
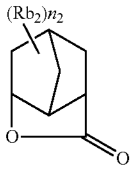
LC1-5
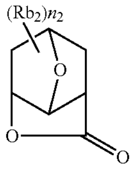
LC1-6
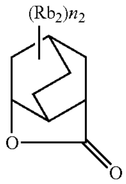
LC1-7
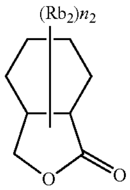
LC1-8
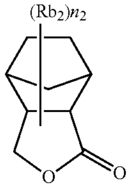
LC1-9
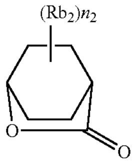
-continued
LC1-10
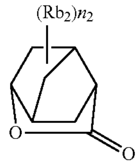
LC1-11
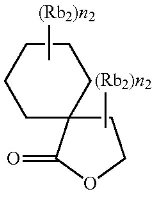
LC1-12
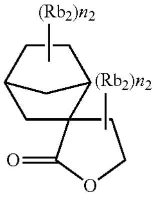
LC1-13
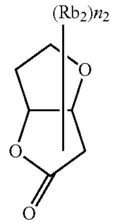
LC1-14
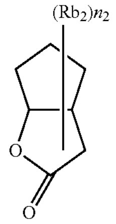
LC1-15
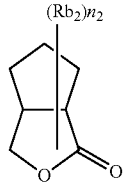
LC1-16
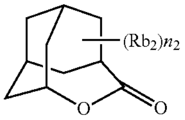
LC1-17
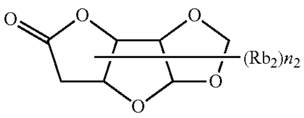
The lactone structure portion may have a substituent ($Rb_2$). As the substituent ($Rb_2$), for example, an alkyl group having 1 to 8 carbon atoms, a cycloalkyl group having 4 to 7 carbon atoms, an alkoxy group having 1 to 8 carbon atoms, an alkoxycarbonyl group having 2 to 8 carbon atoms, a carboxyl group, a halogen atom, a hydroxyl group, a cyano group, an acid-decomposable group, and the like are preferable. $n_2$ represents an integer of 0 to 4. In a case where $n_2$ 2 or more, a plurality of substituents ($Rb_2$) may be the same as or different from each other, and a plurality of substituents ($Rb_2$) may be bonded to each other to form a ring.

The resin P may further contain a repeating unit containing an organic group having a polar group, particularly, a repeating unit having an alicyclic hydrocarbon structure substituted with a polar group.

As the alicyclic hydrocarbon structure substituted with a polar group, an adamantyl group, a diamantyl group, or a norbornane group is preferable. As the polar group, a hydroxyl group or a cyano group is preferable.

In a case where the resin P contains the repeating unit containing an organic group having a polar group, the content of the repeating unit with respect to all the repeating units in the resin P is preferably 1 to 50 mol %, more preferably 1 to 30 mol %, and even more preferably 5 to 25 mol %.

The resin P is preferably a resin including a repeating unit selected from the group consisting of a repeating unit represented by Formula (a), a repeating unit represented by Formula (b), a repeating unit represented by Formula (c), a repeating unit represented by Formula (d), and a repeating unit represented by Formula (e).

(a)

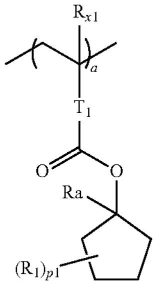

(b)

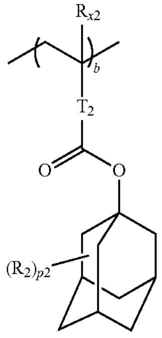

(c)

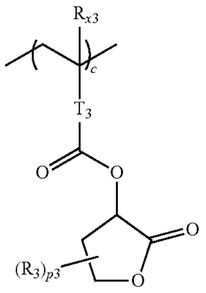

-continued (d)

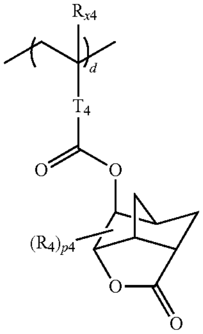

(e)

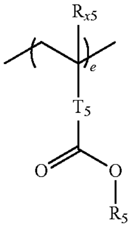

$R_{x1}$ to $R_{x5}$ each independently represent a hydrogen atom or an alkyl group which may have a substituent.

$R_1$ to $R_4$ each independently represent a monovalent substituent, and p1 to p4 each independently represent 0 or a positive integer.

Ra represents a linear or branched alkyl group.

$T_1$ to $T_5$ each independently represent a single bond or a divalent linking group.

$R_5$ represents a monovalent organic group.

a to e each represent mol %. a to e each independently represent a number included in a range of $0 \leq a \leq 100$, $0 \leq b \leq 100$, $0 \leq c < 100$, $0 \leq d < 100$, and $0 \leq e < 100$. Here, $a+b+c+d+e=100$, and $a+b \neq 0$.

The repeating unit (e) has a structure different from all of the repeating units (a) to (d).

Examples of the alkyl group represented by $R_{x1}$ to $R_{x5}$ that may have a substituent include a methyl group and a group represented by $-CH_2-R_{11}$. $R_{11}$ represents a halogen atom (such as a fluorine atom), a hydroxyl group, or a monovalent organic group.

$R_{x1}$ to $R_{x5}$ preferably each independently represent a hydrogen atom, a methyl group, a trifluoromethyl group, or a hydroxymethyl group.

Examples of the divalent linking group represented by $T_1$ to $T_5$ include an alkylene group, a —COO-Rt- group, a —O-Rt- group, and the like. In the formulae, Rt represents an alkylene group or a cycloalkylene group.

$T_1$ to $T_5$ preferably each independently represent a single bond or a —COO-Rt- group. Rt is preferably an alkylene group having 1 to 5 carbon atoms, and more preferably a $-CH_2-$ group, a $-(CH_2)_2-$ group, or a $-(CH_2)_3-$ group.

Ra represents a linear or branched alkyl group. Examples thereof include a methyl group, an ethyl group, a t-butyl group, and the like. Among these, a linear or branched alkyl group having 1 to 4 carbon atoms is preferable.

$R_1$ to $R_4$ each independently represent a monovalent substituent. $R_1$ to $R_4$ are not particularly limited, and examples thereof include a hydroxyl group, a cyano group, and a linear or branched alkyl or cycloalkyl group having a hydroxyl group, a cyano group, and the like.

p1 to p4 each independently represent 0 or a positive integer. The upper limit of p1 to p4 equals the number of hydrogen atoms which can be substituted in each repeating unit.

$R_5$ represents a monovalent organic group. $R_5$ is not particularly limited, and examples thereof include a monovalent organic group having a sultone structure, a monovalent organic group having a cyclic ether such as tetrahydrofuran, dioxane, 1,4-thioxane, dioxolane, and 2,4,6-trioxabicyclo[3.3.0]octane, and an acid-decomposable group (for example, an adamantyl group quaternized by the substitution of carbon at a position bonded to a —COO group with an alkyl group).

The repeating unit (b) is preferably formed of the monomer described in paragraphs "0014" to "0018" in JP2016-138219A.

a to e each represent mol %. a to e each independently represent a number included in a range of $0 \leq a \leq 100$, $0 \leq b \leq 100$, $0 \leq c < 100$, $0 \leq d < 100$, and $0 \leq e < 100$. Here, $a+b+c+d+e=100$, and $a+b \neq 0$.

a+b is preferably 20 to 90 mol %, more preferably 25 to 85 mol %, and even more preferably 30 to 80 mol %.

Furthermore, c+d (the content of the repeating unit having a lactone structure with respect to all the repeating units) is preferably 3 to 80 mol %, and more preferably 3 to 60 mol %.

The weight-average molecular weight of the resin P that is measured by gel permeation chromatography (GPC) and expressed in terms of polystyrene is preferably 1,000 to 200,000, and more preferably 3,000 to 20,000.

The content of the resin P in the total solid content of the resist composition is preferably 50% to 99.9% by mass, and more preferably 60% to 99.0% by mass.

The resist composition may contain components other than the resin P described above (for example, an acid generator, a basic compound, a quencher, a hydrophobic resin, a surfactant, a solvent, and the like).

As those other components, known components can be used. Examples of those other components to be incorporated into the resist composition include components incorporated into the actinic ray-sensitive or radiation-sensitive resin compositions described in JP2013-195844A, JP2016-057645A, JP2015-207006A, WO2014/148241A, JP2016-188385A, and JP2017-219818A, and the like.

(Step 3)

Step 3 is a step of exposing the coating film (resist film) (exposure step).

The type of actinic rays and radiation used for exposure is not particularly limited. As the actinic rays and radiation, light having a wavelength of 250 nm or less is preferable. Examples thereof include KrF excimer laser beams (248 nm), ArF excimer laser beams (193 nm), $F_2$ excimer laser beams (157 nm), EUV light (13.5 nm), electron beams, and the like.

During the exposure, if necessary, the coating film may be exposed through a mask.

(Step 4)

Step 4 is a step of forming a resist pattern by developing the exposed coating film (resist film) with a developer (development step).

Examples of the development method include a method of immersing the substrate in a tank filled with a developer for a certain period of time (dipping method), a method of heaping up a developer on a surface of the substrate by surface tension and left the developer to stand for a certain period of time for development (puddle method), a method of spraying a developer on a surface of the substrate (spray method), a method of continuously jetting a developer onto a substrate rotating at a constant speed from a jet nozzle while scanning the substrate with the nozzle (dynamic dispensing method), and the like.

The development time is preferably 10 to 300 seconds, and more preferably 20 to 120 seconds.

The temperature of the developer is preferably 0° C. to 50° C., and more preferably 15° C. to 35° C.

As the developer, known developers (such as an organic solvent and an alkaline aqueous solution) may be used.

If necessary, the developer may contain a surfactant.

(Step 5)

The resist pattern forming method may further include Step 5 (rinsing step) following Step 4.

Step 5 is a step of washing the resist pattern by using a rinsing solution.

Examples of the rinsing method include a method of immersing the substrate in a tank filled with a rinsing solution for a certain period of time (dipping method), a method of heaping up a rinsing solution on a surface of the substrate by surface tension and left the rinsing solution to stand for a certain period of time for development (puddle method), a method of spraying a rinsing solution on a surface of the substrate (spray method), a method of continuously jetting a rinsing solution onto a substrate rotating at a constant speed from a jet nozzle while scanning the substrate with the nozzle (dynamic dispensing method), and the like.

The rinsing time is preferably 10 to 300 seconds, and more preferably 20 to 120 seconds.

The temperature of the rinsing solution is preferably 0° C. to 50° C., and more preferably 15° C. to 35° C.

As the rinsing solution, known rinsing solutions (such as an organic solvent and water) may be used.

It is preferable that the resist pattern forming method be used for manufacturing semiconductor chips.

EXAMPLES

Hereinafter, the present invention will be more specifically described based on examples. The materials, the amounts and ratios of the materials used, the details of treatments, the procedures of treatments, and the like shown in the following examples can be appropriately changed as long as the gist of the present invention is maintained. Accordingly, the scope of the present invention is not limited to the following examples.

Unless otherwise specified, "%", "ppm", "ppb", and "ppt" shown in the following tables mean "% by mass", "ppm by mass", "ppb by mass", and "ppt by mass" respectively.

For preparing chemical liquids of examples and comparative examples, the handling of containers, and the preparation, filling, storage, and analytical measurement of chemical liquids were all performed in a clean room of a level satisfying ISO Class 2 or 1.

[Manufacturing of Chemical Liquid]

<Substance to be Purified>

For manufacturing chemical liquids of examples and comparative examples, cyclohexanones A to U were used as substances to be purified.

Cyclohexanones A to U differ from each other in terms of one or more conditions selected from the group consisting of the manufacturer, the storage period, the material of the liquid contact portion of the storage container, the void volume of the container during storage, and the storage temperature.

The manufacturers were selected from (1) Toyo Gosei Co., Ltd, (2) Honeywell International Inc, (3) UBE INDUSTRIES, LTD., (4) Showadenkosya.co.ltd. (5) FUJIFILM Ultra Pure Solutions, Inc., (6) Alfa Aeser, (7) W. L. Gore & Associates, Inc., (8) Shiny Chemical Industrial Co., Ltd., and (9) FUJIFILM Electronic Materials U.S.A., Inc. All the cyclohexanones purchased from these companies were semiconductor grade.

The storage period was 1 to 24 months.

The material of the liquid contact portion of the storage container was electropolished stainless steel, non-electropolished stainless steel, PTFE, or polyethylene.

The void volume of the container during storage was 1% to 95% by volume.

The storage temperature was 5° C. to 50° C.

Note that Cyclohexanone E (raw material E) was used immediately after purchased from (9) FUJIFILM Electronic Materials U.S.A., Inc. without being stored.

<Packing Container>

The following containers were used as containers for storing the chemical liquid.

EP-SUS: A container having a liquid contact portion made of electropolished stainless steel.

PFA: A container having a liquid contact portion coated with perfluoroalkoxyalkane.

Table 1 shows the void volume of the chemical liquid in each container.

<Purification Procedure>

One of the above substances to be purified was selected and subjected to the distillation and purification treatment described in Table 1.

In the column of "Distillation and purification" in the table, "Performed-1" means that atmospheric distillation was performed once by using a distillation column (theoretical number of plates: 15).

"Performed-2" means that distillation under reduced pressure was performed once by using a distillation column (theoretical number of plates: 25).

"Performed-3" means that distillation under reduced pressure was performed twice by using a distillation column (theoretical number of plates: 25).

"Performed-4" means that distillation under reduced pressure was performed once by using a distillation column (theoretical number of plates: 20).

"Performed-5" means that distillation under reduced pressure was performed twice by using a distillation column (theoretical number of plates: 20).

"Performed-6" means that distillation under reduced pressure was performed once by using a distillation column (theoretical number of plates: 8).

"Performed-7" means that atmospheric distillation was performed once by using a distillation column (theoretical number of plates: 25).

"Performed-8" means that atmospheric distillation was performed once by using a distillation column (theoretical number of plates: 20).

"Performed-9" means that atmospheric distillation was performed twice by using a distillation column (theoretical number of plates: 30).

"Performed-10" means that atmospheric distillation was performed twice by using a distillation column (theoretical number of plates: 35).

"N/A" means that distillation was not performed.

Then, the distilled and purified substance to be purified was stored in a storage tank. The substance to be purified stored in the storage tank was filtered by being passed through the filters 1 to 4 described in Table 1 in this order, and stored in a container.

Thereafter, as shown in Table 1 which will be described later, in the example for which "Performed" is listed in the column of "First circulation", a recirculation filtration treatment was performed in which the substance to be purified stored in the container was filtered through the filters 5 to 7 described in Table 1, circulated to the upstream side of the filter 5 after being filtered through the filter 7, and then filtered again through the filters 5 to 7. After the recirculation filtration treatment, the chemical liquid was stored in a container.

As shown in Table 1 which will be described later, in the example for which "N/A" is listed in the column of "First circulation", the substance to be purified stored in the storage tank was filtered through the filters 5 to 7 described in Table 1 without being subjected to the aforementioned circulation treatment.

Subsequently, as shown in Table 1 which will be described later, in the example for which "Performed" is listed in the column of "Second circulation", a recirculation filtration treatment was performed in which the obtained substance to be purified was filtered through the filter 8 described in Table 1, circulated to the upstream side of the filter 8 after being filtered through the filter 8, and filtered again through the filter 8.

In a case where the column showing the used filter is left blank, it means that filtration using the filter was not performed. For example, in Example 1, recirculation filtration was performed using only filters 5 and 6.

After being filtered through filters 5 to 7 (and through a filter 8 in a case where filtration using the filter 8 was performed), the substance to be purified (chemical liquid) was first stored in a container and then stored in a container (packing container) shown in Table 1 at the void volume (% by volume) shown in Table 1.

(Filter)

As filters, the following filters were used.

"PP": Polypropylene filter, manufactured by Pall Corporation.

"IEX": Ion exchange resin filter, manufactured by Entegris.

"PTFE": Polytetrafluoroethylene filter, manufactured by Entegris.

"Nylon": 6,6-Nylon filter, manufactured by Pall Corporation.

In Table 1, the diameter listed together with the material of the used filter represents the pore size of the filter. For example, the description of "PP 200 nm" means that a polypropylene filter having a pore size of 200 nm manufactured by Pall Corporation. was used.

Unless otherwise specified, the liquid contact portion of various devices (such as a distillation column, piping, a storage tank, and a container) coming into contact with the substance to be purified in the series of purification process described above was constituted with electropolished stainless steel.

[Analysis]

The contents of the organic components and metal components in the chemical liquid were measured by the following method.

<Content of Organic Component>

The content of the organic component in the chemical liquid was measured using a gas chromatography-mass spectrometry (GC/MS) (manufactured by Agilent Technologies, Inc., GC: 7890B, MS: 5977B EI/CI MSD).

<Content of Metal Components>

The content of the metal components (metal ions and metal-containing particles) in the chemical liquid was measured by a method using ICP-MS and SP-ICP-MS.

The used devices are as follows.

Manufacturer: PerkinElmer Inc.

Model: NexION350S

The following analysis software was used for analysis.

Syngistix nano application module dedicated for "SP-ICP-MS"

Syngistix for ICP-MS software

[Evaluation]

The manufactured chemical liquids were evaluated by the following method.

<Defect Inhibition Performance (Residue Inhibition Performance)>

The defect inhibition performance of the chemical liquids was evaluated by the following method.

A resist pattern was formed by the following operation.

First, a silicon substrate having a diameter of 300 mm was coated with an organic antireflection film-forming composition ARC29SR (manufactured by Nissan Chemical Corporation) and baked at 205° C. for 60 seconds, thereby forming an antireflection film having a film thickness of 78 nm.

In order to improve coating properties, a prewet solution (each of the chemical liquids of examples or comparative examples was used) was added dropwise to the surface of the antireflection film in the silicon wafer on which the antireflection film was formed, and spin coating was performed.

After the prewetting step described above, the antireflection film was coated with the prepared "actinic ray-sensitive or radiation-sensitive resin composition 1 (shown below)" and prebaked (PB) at 100° C. for 60 seconds, thereby forming a resist film having a film thickness of 150 nm.

By using an ArF excimer laser scanner (NA: 0.75), pattern exposure was performed on the obtained wafer at 25 [mJ/$cm^2$]. Then, the wafer was baked (PEB) at 120° C. for 60 seconds. The wafer was then subjected to puddle development for 30 seconds in butyl acetate manufactured by Fuji Electric Taiwan Co., Ltd. Subsequently, the wafer was rotated at a rotation speed of 4,000 rpm for 30 seconds, thereby forming a negative resist pattern. The obtained negative resist pattern was then post-baked (POB) at 200° C. for 300 seconds. Through the above steps, an L/S resist pattern at line/space of 1:1 was obtained.

(Actinic Ray-Sensitive or Radiation-Sensitive Resin Composition 1)

Acid-decomposable resin (resin represented by the following formula (weight-average molecular weight (Mw): 7,500): the numerical value described in each repeating unit means mol %): 100 parts by mass

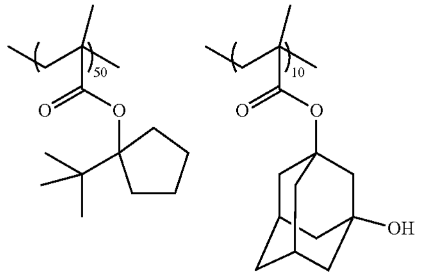

-continued

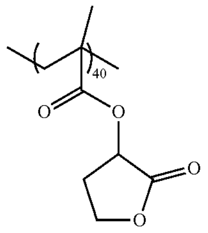

The following photoacid generator: 8 parts by mass

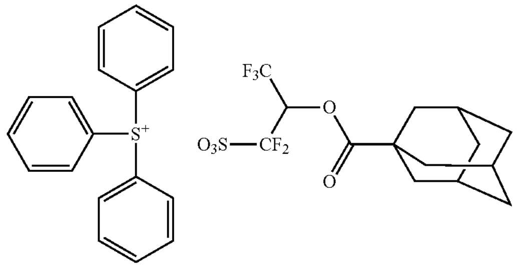

The following quencher: 5 parts by mass (the mass ratio was 0.1:0.3:0.3:0.2 in this order from the left). Among the following quenchers, a polymer-type quencher has a weight-average molecular weight (Mw) of 5,000. The numerical value described in each repeating unit means molar ratio.

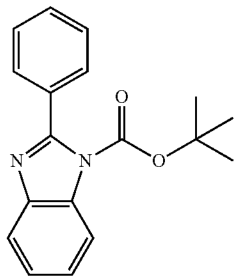

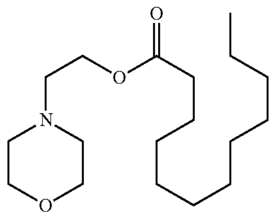

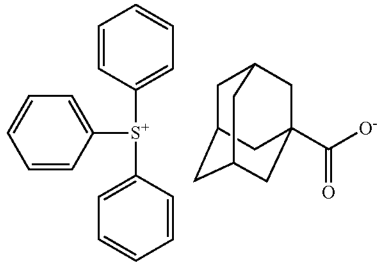

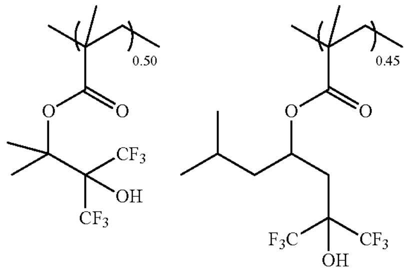

-continued

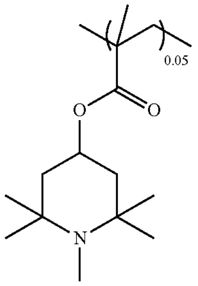

The following hydrophobic resins: 4 parts by mass (the mass ratio was 0.5:0.5 in this order from the left).

Among the following hydrophobic resins, the hydrophobic resin on the left side has a weight-average molecular weight (Mw) of 7,000, and the hydrophobic resin on the right side has a weight-average molecular weight (Mw) of 8,000. In each of the hydrophobic resins, the numerical value described in each repeating unit means molar ratio.

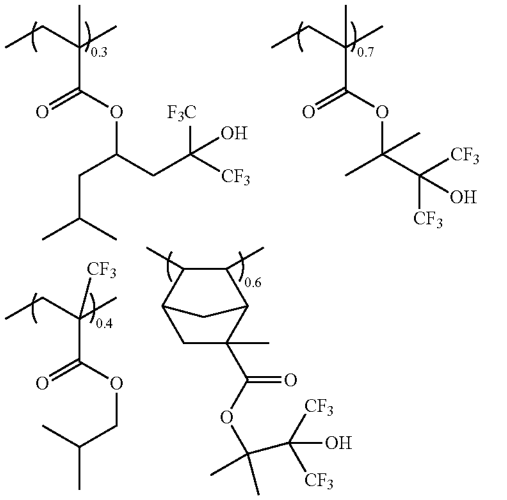

Solvent:

Propylene glycol monomethyl ether acetate (PGMEA): 3 parts by mass

Cyclohexanone: 600 parts by mass

γ-Butyrolactone (γ-BL): 100 parts by mass

By using a pattern defect inspection device (multipurpose Scanning Electron Microscope (SEM) "inspago" RS6000 series manufactured by Hitachi High-Tech Corporation.), the number of defects based on residues during development on the resist pattern of the wafer on which the resist pattern was formed as above was counted.

By using the counted number of defects based on the residues during development, defect inhibition performance (residue inhibition performance) was evaluated according to the following standard.

"A": The number of defects was 100/wafer or less.

"B": The number of defects was more than 100/wafer and 200/wafer or less.

"C": The number of defects was more than 200/wafer and 300/wafer or less.

"D": The number of defects was more than 300/wafer and 400/wafer or less.

"E": The number of defects was more than 400/wafer and 500/wafer or less.

"F": The number of defects was more than 500/wafer.

<Evaluation Over Time>

Each chemical liquid was stored at 30° C. for 1 year. Then, the stored chemical liquid was subjected to the above test (evaluation of defect inhibition performance) and evaluated according to the following standard.

"A": A difference between the counted number of defects formed using the chemical liquid before storage (number of defects based on residues during development) and the counted number of defects formed using the chemical liquid after storage (number of defects formed using chemical liquid after storage–number of defects formed using chemical liquid before storage) is less than 3.0% of the number of defects formed using the chemical liquid before storage.

"B": A difference between the counted number of defects formed using the chemical liquid before storage and the counted number of defects formed using the chemical liquid after storage (number of defects formed using chemical liquid after storage–number of defects formed using chemical liquid before storage) is 3.0% or more and less than 5.0% of the number of defects formed using the chemical liquid before storage.

"C": A difference between the counted number of defects formed using the chemical liquid before storage and the counted number of defects formed using the chemical liquid after storage (number of defects formed using chemical liquid after storage–number of defects formed using chemical liquid before storage) is 5.0% or more of the number of defects formed using the chemical liquid before storage.

<Resist Composition-Saving Performance>

A silicon substrate having a diameter of 300 nm was coated with a prewet solution which was the chemical liquid of each of examples or comparative examples, and then further coated with Resist #4415 (resist composition) manufactured by FUJIFILM Electronic Materials Co., Ltd. applied in an amount varied in a range of 0.4 to 0.2 ml, thereby forming resist films. For the resist films obtained as above, a film thickness was measured, and a resist composition application amount in which the in-plane thickness uniformity of the resist film was 3% or less was checked. It is possible to conclude that the smaller the resist composition application amount in which the in-plane thickness uniformity of the resist film is 3% or less, the higher the resist composition-saving performance of the chemical liquid.

"A": The in-plane thickness uniformity of the resist film was 3% or less in an application amount of 0.20 ml.

"B": The in-plane thickness uniformity of the resist film was 3% or less in an application amount of more than 0.20 ml and 0.25 ml or less.

"C": The in-plane thickness uniformity of the resist film was 3% or less in an application amount of more than 0.25 ml and 0.30 ml or less.

"D": The in-plane thickness uniformity of the resist film was 3% or less in an application amount of more than 0.30 ml and 0.40 ml or less. Alternatively, the in-plane thickness uniformity of the resist film was not 3% or less even in an application amount of 0.40 ml.

[Result]

Table 1 shows the chemical liquid manufacturing methods, analysis results, and evaluation results relating to each of examples and comparative examples.

In Table 1, the column in which "Ratio X (X: an integer of 1 to 10)" is listed shows the mass ratio between the contents of components in the chemical liquid that are listed next to Ratio X.

For example, the column of "Ratio 1 Formula 1 compound/Formula 2 compound" shows the mass ratio of the content of Formula 1 compound to the content of Formula 2 compound (mass of Formula 1 compound contained/mass of Formula 2 compound contained) in the chemical liquid.

The column of "Total amount (ppt)" in the column of "Metal components" shows the total content of one or more kinds of metal components selected from the group consisting of a particulate metal component and an ionic metal component.

The column of "Fe particles (ppt)" shows the content of the Fe-containing particulate metal component having a particle diameter of 15 to 20 nm with respect to the total mass of the chemical liquid. The column of "Pd particles (ppt)" shows the content of a Pd-containing particulate metal component having a particle diameter of 15 to 20 nm with respect to the total mass of the chemical liquid.

The column of "High-boiling-point organic compound" shows the content of a high-boiling-point organic compound, which is a compound other than cyclohexanone derivatives and has a boiling point of 450° C. or higher, with respect to the total mass of the chemical liquid.

The column of "Number of requirements satisfied" shows the number of the following Requirements 1 to 19 that the chemical liquid of each example satisfies.

Requirement 1: The content of Formula 1 compound is 0.01 to 70 ppm by mass with respect to the total mass of the chemical liquid.

Requirement 2: The total content of the first compounds is 0.005 to 95 ppm by mass with respect to the total mass of the chemical liquid.

Requirement 3: The mass ratio of the content of Formula 1 compound to the content of Formula 2 compound (content of Formula 1 compound/content of Formula 2 compound) in the chemical liquid is 1 to 500.

Requirement 4: The mass ratio of the content of Formula 1 compound to the content of Formula 3 compound (content of Formula 1 compound/content of Formula 3 compound) in the chemical liquid is 1 to 3,000.

Requirement 5: The mass ratio of the content of Formula 2 compound to the content of Formula 3 compound (content of Formula 2 compound/content of Formula 3 compound) in the chemical liquid is 1 to 150.

Requirement 6: The total content of hydroxycyclohexanones is 0.001 to 1,000 ppm by mass with respect to the total mass of the chemical liquid.

Requirement 7: The mass ratio of the content of 2-hydroxycyclohexanone to the content of 3-hydroxycyclohexanone (content of 2-hydroxycyclohexanone/content of 3-hydroxycyclohexanone) is 0.005 to 300 in the chemical liquid.

Requirement 8: The mass ratio of the content of 2-hydroxycyclohexanone to the content of 4-hydroxycyclohexanone (content of 2-hydroxycyclohexanone/content of 4-hydroxycyclohexanone) is 0.01 to 15 in the chemical liquid.

Requirement 9: The mass ratio of the content of 3-hydroxycyclohexanone to the content of 4-hydroxycyclohexanone (content of 3-hydroxycyclohexanone/content of 4-hydroxycyclohexanone) is 0.003 to 100 in the chemical liquid.

Requirement 10: The content of 1,2-cyclohexanedione is 0.0005 to 40 ppm by mass with respect to the total mass of the chemical liquid.

Requirement 11: The content of cyclohexanol is 0.0003 to 30 ppm by mass with respect to the total mass of the chemical liquid.

Requirement 12: The content of 1-hexanoic acid is 5 to 600 ppm by mass with respect to the total mass of the chemical liquid.

Requirement 13: The mass ratio of the content of 1,2-cyclohexanedione to the content of cyclohexanol (content of 1,2-cyclohexanedione/content of cyclohexanol) is 0.2 to 400 in the chemical liquid.

Requirement 14: The mass ratio of the content of 1,2-cyclohexanedione to the content of 1-hexanoic acid (content of 1,2-cyclohexanedione/content of 1-hexanoic acid) is 0.005 to 5 in the chemical liquid.

Requirement 15: The mass ratio of the content of cyclohexanol to the content of 1-hexanoic acid (content of cyclohexanol/content of 1-hexanoic acid) is 0.0005 to 0.5 in the chemical liquid.

Requirement 16: The total content of the second compounds is 0.5 to 10 ppm by mass with respect to the total mass of the chemical liquid.

Requirement 17: The total content of metal components is 10 to 350 ppt by mass with respect to the total mass of the chemical liquid.

Requirement 18: The mass ratio of the content of Fe-containing metal particles having a particle diameter of 15 to 20 nm to the content of Pd-containing metal particles having a particle diameter of 15 to 20 nm (content of Fe-containing metal particles having a particle diameter of 15 to 20 nm/content of Pd-containing metal particles having a particle diameter of 15 to 20 nm) is 1 to 23 in the chemical liquid.

Requirement 19: The total content of high-boiling-point organic compounds is 10 to 1,000 ppb by mass with respect to the total mass of the chemical liquid.

TABLE 1

| Purification procedure | | | | | | | | | | | | | | |
|---|---|---|---|---|---|---|---|---|---|---|---|---|---|---|
| | Raw material | Distillation and purification | Filter 1 | Filter 2 | Filter 3 | Filter 4 | Filter 5 | Filter 6 | Filter 7 | First circulation | Filter 8 | Second circulation | Packing container | Void volume (%) |
| Example 1 | A | Performed-1 | PP 200 nm | IEX 50 nm | PTFE 10 nm | Nylon 10 nm | PTFE 5 nm | Nylon 5 nm | | Performed | | | EP-SUS | 5 |
| Example 2 | B | Performed-2 | PP 200 nm | IEX 50 nm | PTFE 10 nm | Nylon 10 nm | PTFE 5 nm | Nylon 5 nm | | N/A | | | EP-SUS | 5 |
| Example 3 | C | Performed-3 | PP 200 nm | IEX 50 nm | PTFE 10 nm | Nylon 10 nm | PTFE 5 nm | Nylon 5 nm | | Performed | | | EP-SUS | 5 |
| Example 4 | D | Performed-4 | PP 200 nm | IEX 50 nm | PTFE 10 nm | Nylon 10 nm | PTFE 5 nm | Nylon 5 nm | | Performed | | | EP-SUS | 5 |
| Example 5 | E | Performed-5 | PP 200 nm | IEX 50 nm | PTFE 10 nm | Nylon 10 nm | PTFE 5 nm | Nylon 5 nm | | N/A | | | EP-SUS | 5 |

TABLE 1-continued

| | Purification procedure | | | | | | | | | | | | | |
|---|---|---|---|---|---|---|---|---|---|---|---|---|---|---|
| | Raw material | Distillation and purification | Filter 1 | Filter 2 | Filter 3 | Filter 4 | Filter 5 | Filter 6 | Filter 7 | First circulation | Filter 8 | Second circulation | Packing container | Void volume (%) |
| Example 6 | F | Performed-6 | PP 200 nm | IEX 50 nm | PTFE 10 nm | Nylon 10 nm | PTFE 5 nm | Nylon 5 nm | | Performed | | | EP-SUS | 5 |
| Example 7 | G | Performed-7 | PP 200 nm | IEX 50 nm | PTFE 10 nm | Nylon 10 nm | PTFE 5 nm | Nylon 5 nm | | N/A | | | EP-SUS | 5 |
| Example 8 | H | Performed-8 | PP 200 nm | IEX 50 nm | PTFE 10 nm | Nylon 10 nm | PTFE 5 nm | Nylon 5 nm | | Performed | | | EP-SUS | 5 |
| Example 9 | I | Performed-9 | PP 200 nm | IEX 50 nm | PTFE 10 nm | Nylon 10 nm | PTFE 5 nm | Nylon 5 nm | | Performed | | | EP-SUS | 5 |
| Example 10 | J | Performed-1 | PP 200 nm | IEX 50 nm | IEX 50 nm | PTFE 10 nm | PTFE 5 nm | Nylon 3 nm | | Performed | | | PFA | 5 |
| Example 11 | K | Performed-1 | PP 200 nm | IEX 50 nm | IEX 50 nm | Nylon 10 nm | PTFE 5 nm | Nylon 5 nm | | Performed | | | EP-SUS | 5 |
| Example 12 | L | Performed-1 | PP 200 nm | IEX 50 nm | IEX 50 nm | IEX 50 nm | PTFE 5 nm | Nylon 5 nm | | N/A | | | EP-SUS | 5 |
| Example 13 | M | Performed-1 | PP 100 nm | IEX 50 nm | IEX 50 nm | Nylon 10 nm | PTFE 5 nm | Nylon 5 nm | | Performed | | | EP-SUS | 5 |
| Example 14 | N | Performed-2 | PP 200 nm | IEX 50 nm | IEX 50 nm | PTFE 10 nm | PTFE 5 nm | Nylon 3 nm | | Performed | | | EP-SUS | 5 |
| Example 15 | O | Performed-3 | PP 200 nm | IEX 50 nm | IEX 50 nm | PTFE 10 nm | PTFE 5 nm | Nylon 5 nm | | Performed | | | EP-SUS | 5 |
| Example 16 | P | Performed-5 | PP 200 nm | IEX 50 nm | IEX 50 nm | PTFE 10 nm | PTFE 5 nm | Nylon 5 nm | | Performed | | | EP-SUS | 5 |
| Example 17 | Q | Performed-5 | PP 200 nm | IEX 50 nm | IEX 50 nm | PTFE 10 nm | PTFE 5 nm | Nylon 3 nm | | Performed | | | EP-SUS | 5 |
| Example 18 | R | Performed-5 | PP 200 nm | IEX 50 nm | IEX 50 nm | Nylon 10 nm | PTFE 5 nm | Nylon 5 nm | Nylon 5 nm | N/A | UPE 3 nm | Performed | EP-SUS | 5 |
| Example 19 | S | Performed-5 | PP 200 nm | IEX 50 nm | IEX 50 nm | IEX 50 nm | PTFE 5 nm | Nylon 5 nm | Nylon 5 nm | N/A | UPE 3 nm | Performed | EP-SUS | 5 |
| Example 20 | T | Performed-5 | PP 100 nm | IEX 50 nm | PTFE 10 nm | Nylon 10 nm | PTFE 5 nm | Nylon 5 nm | Nylon 5 nm | N/A | UPE 3 nm | Performed | EP-SUS | 5 |
| Comparative Example 1 | U | Performed-5 | PP 200 nm | IEX 50 nm | PTFE 10 nm | Nylon 10 nm | PTFE 5 nm | Nylon 5 nm | | N/A | | | EP-SUS | 5 |
| Comparative Example 2 | A | — | PP 200 nm | IEX 50 nm | PTFE 10 nm | Nylon 10 nm | PTFE 5 nm | Nylon 5 nm | | Performed | | | EP-SUS | 5 |
| Comparative Example 3 | A | Performed-10 | PP 200 nm | IEX 50 nm | PTFE 10 nm | Nylon 10 nm | PTFE 5 nm | Nylon 5 nm | | Performed | | | EP-SUS | 5 |

TABLE 2

| | Components of chemical liquid and content thereof | | | | | | | | |
|---|---|---|---|---|---|---|---|---|---|
| | | | First compounds | | | | Ratio 1 Formula 1 compound/ | Ratio 2 Formula 1 compound/ | Ratio 3 Formula 2 compound/ |
| Table 1 (continued) | Purity (cyclo-hexanone content) | Water content | Formula 1 compound | Formula 2 compound | Formula 3 compound | Total amount | Formula 2 compound | Formula 3 compound | Formula 3 compound |
| Example 1 | 99.500 % | 100 ppm | 0.05 ppm | 0.03 ppm | 0.003 ppm | 0.083 ppm | 1.7 | 16.7 | 10.0 |
| Example 2 | 99.500 % | 100 ppm | 0.06 ppm | 0.005 ppm | 0.001 ppm | 0.066 ppm | 12.0 | 60.0 | 5.0 |
| Example 3 | 99.500 % | 100 ppm | 0.04 ppm | 0.03 ppm | 0.004 ppm | 0.074 ppm | 1.3 | 10.0 | 7.5 |
| Example 4 | 99.500 % | 500 ppm | 0.12 ppm | 0.001 ppm | 0.002 ppm | 0.123 ppm | 120.0 | 60.0 | 0.5 |
| Example 5 | 99.500 % | 10 ppm | 0.15 ppm | 0.008 ppm | 0.0008 ppm | 0.1588 ppm | 18.8 | 187.5 | 10.0 |
| Example 6 | 99.500 % | 100 ppm | 0.01 ppm | 0.005 ppm | 0.001 ppm | 0.016 ppm | 2.0 | 10.0 | 5.0 |
| Example 7 | 99.500 % | 100 ppm | 1.1 ppm | 0.002 ppm | 0.002 ppm | 1.104 ppm | 550.0 | 550.0 | 1.0 |
| Example 8 | 99.500 % | 100 ppm | 56 ppm | 2.1 ppm | 0.15 ppm | 58.25 ppm | 26.7 | 373.3 | 14.0 |
| Example 9 | 99.500 % | 100 ppm | 92 ppm | 5.1 ppm | 0.03 ppm | 97.13 ppm | 18.0 | 3,066.7 | 170.0 |
| Example 10 | 99.500 % | 100 ppm | 0.06 ppm | 0.002 ppm | 0.002 ppm | 0.064 ppm | 30.0 | 30.0 | 1.0 |

TABLE 2-continued

| Components of chemical liquid and content thereof | | | | | | | | | | | | | | |
|---|---|---|---|---|---|---|---|---|---|---|---|---|---|---|
| | Purity (cyclo- | | | | First compounds | | | | | | | Ratio 1 Formula 1 compound/ | Ratio 2 Formula 1 compound/ | Ratio 3 Formula 2 compound/ |
| Table 1 (continued) | hexanone content) | | Water content | | Formula 1 compound | | Formula 2 compound | | Formula 3 compound | | Total amount | Formula 2 compound | Formula 3 compound | Formula 3 compound |
| Example 11 | 99. 500 | % | 100 | ppm | 0.07 | ppm | 0.003 | ppm | 0.08 | ppm | 0.153 ppm | 23.3 | 0.9 | 0.04 |
| Example 12 | 99. 500 | % | 100 | ppm | 0.05 | ppm | 0.01 | ppm | 0.003 | ppm | 0.063 ppm | 5.0 | 16.7 | 3.3 |
| Example 13 | 99. 000 | % | 100 | ppm | 0.08 | ppm | 0.09 | ppm | 0.003 | ppm | 0.173 ppm | 0.9 | 26.7 | 30.0 |
| Example 14 | 99. 500 | % | 100 | ppm | 0.07 | ppm | 0.005 | ppm | 0.002 | ppm | 0.077 ppm | 14.0 | 35.0 | 2.5 |
| Example 15 | 99. 500 | % | 100 | ppm | 0.06 | ppm | 0.004 | ppm | 0.004 | ppm | 0.068 ppm | 15.0 | 15.0 | 1.0 |
| Example 16 | 99. 500 | % | 100 | ppm | 0.08 | ppm | 0.02 | ppm | 0.003 | ppm | 0.103 ppm | 4.0 | 26.7 | 6.7 |
| Example 17 | 99. 500 | % | 100 | ppm | 0.07 | ppm | 0.015 | ppm | 0.001 | ppm | 0.086 ppm | 4.7 | 70.0 | 15.0 |
| Example 18 | 99. 500 | % | 100 | ppm | 0.06 | ppm | 0.004 | ppm | 0.003 | ppm | 0.067 ppm | 15.0 | 20.0 | 1.3 |
| Example 19 | 99. 500 | % | 100 | ppm | 0.05 | ppm | 0.01 | ppm | 0.001 | ppm | 0.061 ppm | 5.0 | 50.0 | 10.0 |
| Example 20 | 99. 500 | % | 100 | ppm | 0.06 | ppm | 0.02 | ppm | 0.004 | ppm | 0.084 ppm | 3.0 | 15.0 | 5.0 |
| Comparative Example 1 | 95. 000 | % | Balance | | 0.05 | ppm | 0.004 | ppm | 0.002 | ppm | 0.056 ppm | 12.5 | 25.0 | 2.0 |
| Comparative Example 2 | 99. 950 | % | 100 | ppm | 0.0001 | Ppm | 0.0003 | ppm | 0.0002 | ppm | 0.0006 ppm | 0.3 | 0.5 | 1.5 |
| Comparative Example 3 | 99. 950 | % | 100 | ppm | 106 | ppm | 0.05 | ppm | 0.005 | ppm | 106.055 ppm | 2,120.0 | 21,200.0 | 10.0 |

TABLE 3

| Components of chemical liquid and content thereof | | | | | | | | | | | |
|---|---|---|---|---|---|---|---|---|---|---|---|
| | Hydroxycyclohexanone | | | | | | | | Ratio 4 2-hydroxy-cyclohexanone/ | Ratio 5 2-hydroxy-cyclohexanone/ | Ratio 6 3-hydroxy-cyclohexanone/ |
| Table 1 (continued) | 2-hydroxy-cyclohexanone | | 3-hydroxy-cyclohexanone | | 4-hydroxy-cyclohexanone | | Total amount | | 3-hydroxy cyclohexanone | 4-hydroxy cyclohexanone | 4-hydroxy cyclohexanone |
| Example 1 | 0.01 | ppm | 1 | ppm | 0.019 | ppm | 1.029 | ppm | 0.01 | 0.53 | 52.6 |
| Example 2 | 0.01 | ppm | 1 | ppm | 0.023 | ppm | 1.033 | ppm | 0.01 | 0.43 | 43.5 |
| Example 3 | 0.03 | ppm | 1 | ppm | 0.015 | ppm | 1.045 | ppm | 0.03 | 2.0 | 66.7 |
| Example 4 | 1 | ppm | 1 | ppm | 0.045 | ppm | 2.045 | ppm | 1.0 | 22.2 | 22.2 |
| Example 5 | 3 | ppm | 1 | ppm | 150 | ppm | 154 | ppm | 3.0 | 0.02 | 0.01 |
| Example 6 | 0.05 | ppm | 1 | ppm | 0.004 | ppm | 1.054 | ppm | 0.05 | 12.5 | 250.0 |
| Example 7 | 0.01 | ppm | 1 | ppm | 0.41 | ppm | 1.423 | ppm | 0.01 | 0.02 | 2.4 |
| Example 8 | 0.03 | ppm | 1 | ppm | 21 | ppm | 22.03 | ppm | 0.03 | 0.001 | 0.05 |
| Example 9 | 0.69 | ppm | 1 | ppm | 35 | ppm | 36.69 | ppm | 0.69 | 0.02 | 0.03 |
| Example 10 | 100 | ppm | 60 | ppm | 70 | ppm | 230 | ppm | 1.7 | 1.4 | 0.86 |
| Example 11 | 300 | ppm | 5 | ppm | 1,300 | ppm | 1,605 | ppm | 60.0 | 0.23 | 0.004 |
| Example 12 | 200 | ppm | 40 | ppm | 500 | ppm | 740 | ppm | 5.0 | 0.40 | 0.08 |
| Example 13 | 750 | ppm | 2 | ppm | 1,600 | ppm | 2,352 | ppm | 375.0 | 0.47 | 0.001 |
| Example 14 | 1050 | ppm | 1 | ppm | 150 | ppm | 1201 | ppm | 1,750.0 | 7.0 | 0.004 |
| Example 15 | 0.05 | ppm | 0.2 | ppm | 2,100 | ppm | 2,100 | ppm | 0.25 | 0.00002 | 0.0001 |
| Example 16 | 5 | ppm | 1 | ppm | 100 | ppm | 106 | ppm | 5.0 | 0.05 | 0.01 |
| Example 17 | 8 | ppm | 1 | ppm | 150 | ppm | 159 | ppm | 8.0 | 0.05 | 0.01 |
| Example 18 | 50 | ppm | 1 | ppm | 320 | ppm | 371 | ppm | 50.0 | 0.16 | 0.003 |
| Example 19 | 6 | ppm | 1 | ppm | 120 | ppm | 127 | ppm | 6.0 | 0.05 | 0.01 |
| Example 20 | 7 | ppm | 1 | ppm | 130 | ppm | 138 | ppm | 7.0 | 0.05 | 0.01 |
| Comparative Example 1 | 4.00 | ppm | 1.00 | ppm | 90 | ppm | 95 | ppm | 4.0 | 0.04 | 0.01 |
| Comparative Example 2 | 2.00 | ppm | 1 | ppm | 400 | ppm | 403 | ppm | 2.0 | 0.01 | 0.003 |
| Comparative Example 3 | 0.01 | ppm | 0.30 | ppm | 0.010 | ppm | 0.32 | ppm | 0.03 | 1.00 | 30.00 |

TABLE 4

| Components of chemical liquid and content thereof | | | | | | | | | |
|---|---|---|---|---|---|---|---|---|---|
| | | | | Ratio 7 1,2-cyclo-hexanedione/ | Ratio 8 1,2-cyclo-hexanedione/ | Ratio 9 cyclo-hexanol/ | Second compounds | | |
| Table 1 (continued) | 1,2-Cyclo-hexanedione | Cyclo-hexanol | 1-Hexanoic acid | cyclo-hexanol | 1-hexanoic acid | 1-hexanoic acid | Formula 4 compound | Formula 5 compound | Total amount (ppm) |
| Example 1 | 0.1 ppm | 1 ppm | 6 ppm | 0.10 | 0.02 | 0.17 | 0.3 ppm | 1 ppm | 1.3 |
| Example 2 | 0.2 ppm | 1 ppm | 23 ppm | 0.20 | 0.01 | 0.04 | 0.1 ppm | 1 ppm | 1.1 |
| Example 3 | 0.2 ppm | 1 ppm | 4 ppm | 0.20 | 0.05 | 0.25 | 0.4 ppm | 1 ppm | 1.4 |
| Example 4 | 1 ppm | 1 ppm | 23 ppm | 1.0 | 0.04 | 0.04 | 1 ppm | 1 ppm | 2 |
| Example 5 | 3 ppm | 1 ppm | 150 ppm | 3.00 | 0.02 | 0.01 | 3 ppm | 1 ppm | 4 |
| Example 6 | 1 ppm | 1 ppm | 5 ppm | 0.50 | 0.10 | 0.20 | 2 ppm | 1 ppm | 3 |
| Example 7 | 4 ppm | 1 ppm | 206 ppm | 4.0 | 0.02 | 0.005 | 0.02 ppm | 1 ppm | 1.02 |
| Example 8 | 3 ppm | 1 ppm | 140 ppm | 3.0 | 0.02 | 0.01 | 0.0004 ppm | 1 ppm | 1.0004 |
| Example 9 | 23 ppm | 1 ppm | 1,150 ppm | 23.0 | 0.02 | 0.001 | 0.0002 ppm | 1 ppm | 1.0002 |
| Example 10 | 100 ppm | 60 ppm | 70 ppm | 1.7 | 1.43 | 0.86 | 100 ppm | 60 ppm | 160 |
| Example 11 | 300 ppm | 5 ppm | 1,300 ppm | 60.0 | 0.23 | 0.004 | 300 ppm | 5 ppm | 305 |
| Example 12 | 200 ppm | 40 ppm | 500 ppm | 5.0 | 0.40 | 0.08 | 200 ppm | 40 ppm | 240 |
| Example 13 | 750 ppm | 2 ppm | 1,600 ppm | 375.0 | 0.47 | 0.001 | 750 ppm | 2 ppm | 752 |
| Example 14 | 1,050 ppm | 0.4 ppm | 150 ppm | 2625.0 | 7.00 | 0.003 | 1050 ppm | 0.1 ppm | 1050.1 |
| Example 15 | 0.3 ppm | 0.2 ppm | 2,100 ppm | 1.5 | 0.0001 | 0.0001 | 0.2 ppm | 0.2 ppm | 0.4 |
| Example 16 | 5 ppm | 1 ppm | 100 ppm | 5.0 | 0.05 | 0.01 | 5 ppm | 1 ppm | 6 |
| Example 17 | 8 ppm | 1 ppm | 150 ppm | 8.0 | 0.05 | 0.01 | 8 ppm | 1 ppm | 9 |
| Example 18 | 50 ppm | 1 ppm | 390 ppm | 50.0 | 0.13 | 0.003 | 50 ppm | 1 ppm | 51 |
| Example 19 | 6 ppm | 1 ppm | 120 ppm | 6.0 | 0.05 | 0.01 | 6 ppm | 1 ppm | 7 |
| Example 20 | 7 ppm | 1 ppm | 130 ppm | 7.0 | 0.05 | 0.01 | 7 ppm | 1 ppm | 8 |
| Comparative Example 1 | 4 ppm | 1 ppm | 90 ppm | 4.0 | 0.04 | 0.01 | 4 ppm | 1 ppm | 5 |
| Comparative Example 2 | 5 ppm | 2 ppm | 260 ppm | 2.5 | 0.02 | 0.01 | 10 ppm | 2 ppm | 12 |
| Comparative Example 3 | 0.1 ppm | 0.5 ppm | 3 ppm | 0.2 | 0.03 | 0.17 | 0.1 ppm | 0.4 ppm | 0.5 |

TABLE 5

| Components of chemical liquid and content thereof | | | | | | | Evaluation of chemical liquid | | |
|---|---|---|---|---|---|---|---|---|---|
| | Metal components | | | Ratio 10 Fe | High-boiling- | Number | Defect inhibition | | Resist |
| Table 1 (continued) | Total amount (ppt) | Fe particles (ppt) | Pd particles (ppt) | particles Pd/ particles | point organic compound | of requirements satisfied | performance Number of residues | Evaluation over time | composition-saving performance |
| Example 1 | 9 | 0.7 | 0.03 | 25.00 | 642 ppb | 16 | D | A | A |
| Example 2 | 3 | 1.0 | 0.05 | 20.00 | 526 ppb | 18 | B | A | A |
| Example 3 | 3 | 1.0 | 0.10 | 10.00 | 24 ppb | 17 | C | A | A |
| Example 4 | 4 | 1.3 | 0.18 | 7.50 | 225 ppb | 16 | D | A | A |
| Example 5 | 10 | 3.3 | 1.1 | 3.00 | 186 ppb | 19 | A | A | A |
| Example 6 | 13 | 4.3 | 1.9 | 2.31 | 213 ppb | 18 | B | A | A |
| Example 7 | 12 | 4.0 | 1.6 | 2.50 | 203 ppb | 18 | B | A | A |
| Example 8 | 15 | 5.0 | 2.5 | 2.00 | 238 ppb | 18 | B | A | A |
| Example 9 | 15 | 5.0 | 2.5 | 2.00 | 32 ppb | 14 | D | A | B |
| Example 10 | 20 | 2.0 | 1.3 | 1.50 | 121 ppb | 15 | D | A | A |
| Example 11 | 340 | 75.0 | 113 | 0.67 | 1,021 ppb | 11 | D | B | C |
| Example 12 | 85 | 15.0 | 3.5 | 4.29 | 570 ppb | 16 | D | A | A |
| Example 13 | 90 | 8.0 | 2.0 | 4.00 | 350 ppb | 12 | D | B | C |
| Example 14 | 210 | 10.0 | 1.0 | 10.00 | 54 ppb | 13 | D | A | C |
| Example 15 | 180 | 15.0 | 4.0 | 3.75 | 569 ppb | 12 | D | B | C |
| Example 16 | 20 | 6.7 | 2.0 | 3.33 | 300 ppb | 19 | A | A | A |
| Example 17 | 15 | 5.0 | 2.5 | 2.00 | 63 ppb | 19 | A | A | A |
| Example 18 | 13 | 4.3 | 1.9 | 2.31 | 213 ppb | 17 | C | A | A |
| Example 19 | 30 | 10.0 | 3.0 | 3.33 | 408 ppb | 19 | A | A | A |
| Example 20 | 15 | 5.0 | 2.5 | 2.00 | 8 ppb | 18 | B | A | A |
| Comparative Example 1 | 20 | 6.7 | 2.0 | 3.33 | 300 ppb | — | F | C | D |
| Comparative Example 2 | 45 | 3.0 | 2.0 | 1.50 | 865 ppb | — | F | C | D |
| Comparative Example 3 | 5 | 0.5 | 0.02 | 25.00 | 200 ppb | — | F | C | D |

From the results shown in the table, it has been confirmed that in a case where the chemical liquid according to an embodiment of the present invention is used as a prewet solution, the chemical liquid exhibits excellent defect inhibition performance.

Particularly, it has been confirmed that the larger the number of the aforementioned requirements 1 to 19 satisfied, the higher the effects of the present invention tend to be in the chemical liquid.

What is claimed is:

1. A chemical liquid to be used as a prewet solution, comprising:

cyclohexanone; and one or more kinds of first compounds selected from the group consisting of a compound represented by General Formula (1), a compound represented by General Formula (2), and a compound represented by General Formula (3), wherein a content of the cyclohexanone is 98.000% to 99.999% by mass with respect to a total mass of the chemical liquid, and a total content of the first compounds is 0.001 to 100 ppm by mass with respect to the total mass of the chemical liquid (1)

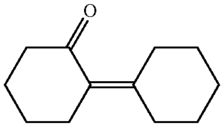

(2)

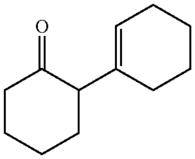

(3)

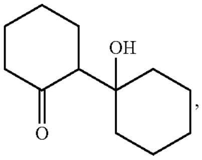
, wherein a mass ratio of a content of the compound represented by General Formula (1) to a content of the compound represented by General Formula (2) is 1 to 500, a mass ratio of a content of the compound represented by General Formula (1) to a content of the compound represented by General Formula (3) is 1 to 3,000, and a mass ratio of a content of the compound represented by General Formula (2) to a content of the compound represented by General Formula (3) is 1 to 150, and wherein the chemical liquid is obtained by subjecting a cyclohexanone raw material to a distillation and purification treatment, wherein the distillation and purification treatment includes performing distillation using a distillation column to obtain a distilled product, and then performing a first filtering of the distilled product by passing through a first filter, a second filter, a third filer, and a fourth filter each made of different materials, and then performing a second filtering by passing through at least a fifth filter and a sixth filter, wherein pore sizes of the fifth filter and the sixth filter are smaller than a pore size of the first filter, the second filter, the third filter, and the fourth filter in the first filtering.

2. The chemical liquid according to claim 1, wherein a content of the compound represented by General Formula (1) is 0.01 to 70 ppm by mass with respect to the total mass of the chemical liquid.

3. The chemical liquid according to claim 1, wherein the total content of the first compounds is 0.005 to 95 ppm by mass with respect to the total mass of the chemical liquid.

4. The chemical liquid according to claim 1, further comprising:

one or more kinds of hydroxycyclohexanones selected from the group consisting of 2-hydroxycyclohexanone, 3-hydroxycyclohexanone, and 4-hydroxycyclohexanone, wherein a total content of the hydroxycyclohexanones is 0.001 to 1,000 ppm by mass with respect to the total mass of the chemical liquid.

5. The chemical liquid according to claim 4, wherein a mass ratio of a content of the 2-hydroxycyclohexanone to a content of the 3-hydroxycyclohexanone is 0.005 to 300.

6. The chemical liquid according to claim 4, wherein a mass ratio of a content of the 2-hydroxycyclohexanone to a content of the 4-hydroxycyclohexanone is 0.01 to 15.

7. The chemical liquid according to claim 4, wherein a mass ratio of a content of the 3-hydroxycyclohexanone to a content of the 4-hydroxycyclohexanone is 0.003 to 100.

8. The chemical liquid according to claim 1, further comprising:

1,2-cyclohexanedione, wherein a content of the 1,2-cyclohexanedione is 0.0005 to 40 ppm by mass with respect to the total mass of the chemical liquid.

9. The chemical liquid according to claim 1, further comprising:

cyclohexanol, wherein a content of the cyclohexanol is 0.0003 to 30 ppm by mass with respect to the total mass of the chemical liquid.

10. The chemical liquid according to claim 1, further comprising:

1-hexanoic acid, wherein a content of the 1-hexanoic acid is 5 to 600 ppm by mass with respect to the total mass of the chemical liquid.

11. The chemical liquid according to claim 1, comprising:

1,2-cyclohexanedione; and cyclohexanol, wherein a mass ratio of a content of the 1,2-cyclohexanedione to a content of the cyclohexanol is 0.2 to 400.

12. The chemical liquid according to claim 1, comprising:

1,2-cyclohexanedione; and 1-hexanoic acid, wherein a mass ratio of a content of the 1,2-cyclohexanedione to a content of the 1-hexanoic acid is 0.005 to 5.

13. The chemical liquid according to claim 1, comprising:

cyclohexanol; and 1-hexanoic acid, wherein a mass ratio of a content of the cyclohexanol to a content of the 1-hexanoic acid is 0.0005 to 0.5.

14. The chemical liquid according to claim 1, further comprising:

one or more kinds of second compounds selected from the group consisting of a compound represented by General Formula (4) and a compound represented by General Formula (5), wherein a total content of the second compounds is 0.5 to 10 ppm by mass with respect to the total mass of the chemical liquid (4)

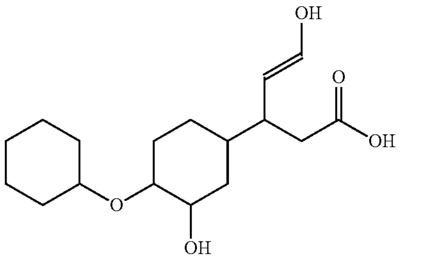

(5)

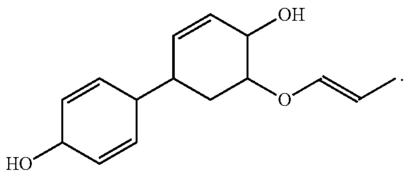

15. The chemical liquid according to claim 1, further comprising:

a high-boiling-point organic compound having a boiling point of 450° C. or higher, wherein a content of the high-boiling-point organic compound is 10 to 1,000 ppb by mass with respect to the total mass of the chemical liquid.

16. The chemical liquid according to claim 1, further comprising:

one or more kinds of metal components selected from the group consisting of a particulate metal component and an ionic metal component, wherein a total content of the metal components is 10 to 350 ppt by mass with respect to the total mass of the chemical liquid.

17. The chemical liquid according to claim 16, comprising:

an Fe-containing particulate metal component having a particle diameter of 15 to 20 nm; and a Pd-containing particulate metal component having a particle diameter of 15 to 20 nm, wherein a mass ratio of a content of the Fe-containing particulate metal component having a particle diameter of 15 to 20 nm to a content of the Pd-containing particulate metal component having a particle diameter of 15 to 20 nm is 1 to 23.

18. The chemical liquid according to claim 1, which is a prewet solution used by being applied to a substrate to be coated with an actinic ray-sensitive or radiation-sensitive resin composition to form a resist film on the substrate, wherein the prewet solution is applied before the substrate is coated with the actinic ray-sensitive or radiation-sensitive resin composition.

19. A resist pattern forming method, comprising:

a prewetting step of coating the substrate with the chemical liquid according to claim 18;

a step of forming a resist film by coating the substrate having undergone the prewetting step with the actinic ray-sensitive or radiation-sensitive resin composition;

a step of exposing the resist film; and a step of obtaining a resist pattern by developing the exposed resist film with a developer.

20. A semiconductor chip manufacturing method, comprising:

the resist pattern forming method according to claim 19.

21. A chemical liquid storage body comprising:

a container; and the chemical liquid according to claim 1 that is stored in the container, wherein a liquid contact portion coming into contact with the chemical liquid in the container is formed of electropolished stainless steel or a fluororesin.

22. The chemical liquid storage body according to claim 21, wherein a void volume in the container determined by Equation (1) is 1% to 20% by volume, $$\text{void volume}=\{1-(\text{volume of the chemical liquid in the container}/\text{volume of the container})\}\times 100. \quad \text{Equation (1)}$$

23. A chemical liquid to be used as a prewet solution, comprising:

cyclohexanone;

one or more kinds of first compounds selected from the group consisting of a compound represented by General Formula (1), a compound represented by General Formula (2), and a compound represented by General Formula (3); and one or more kinds of second compounds selected from the group consisting of a compound represented by General Formula (4) and a compound represented by General Formula (5), wherein a content of the cyclohexanone is 98.000% to 99.999% by mass with respect to a total mass of the chemical liquid, a total content of the first compounds is 0.001 to 100 ppm by mass with respect to the total mass of the chemical liquid, and a total content of the second compounds is 0.5 to 10 ppm by mass with respect to the total mass of the chemical liquid (1)

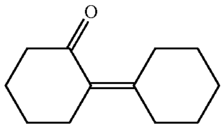

(2)

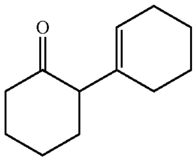

-continued (3)

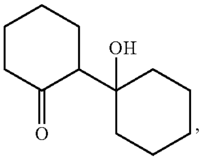

(4)

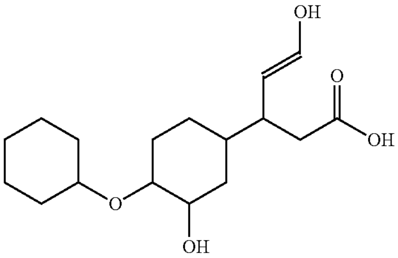

-continued (5)

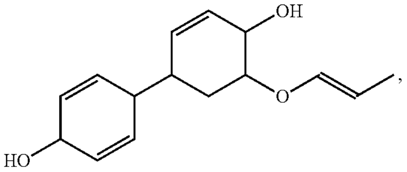

wherein the chemical liquid is obtained by subjecting a cyclohexanone raw material to a distillation and purification treatment, wherein the distillation and purification treatment includes performing distillation using a distillation column to obtain a distilled product, and then performing a first filtering of the distilled product by passing through a first filter, a second filter, a third filer, and a fourth filter each made of different materials, and then performing a second filtering by passing through at least a fifth filter and a sixth filter, wherein pore sizes of the fifth filter and the sixth filter are smaller than a pore size of the first filter, the second filter, the third filter, and the fourth filter in the first filtering.

* * * * *